United States Patent [19]

Cassarino, Jr. et al.

[11] 4,038,537
[45] July 26, 1977

[54] APPARATUS FOR VERIFYING THE INTEGRITY OF INFORMATION STORED IN A DATA PROCESSING SYSTEM MEMORY

[75] Inventors: Frank V. Cassarino, Jr., Weston; Thomas O. Holtey, Newton Lower Falls; Douglas L. Riikonen, Westford, all of Mass.

[73] Assignee: Honeywell Information Systems, Inc., Waltham, Mass.

[21] Appl. No.: 643,453

[22] Filed: Dec. 22, 1975

[51] Int. Cl.[2] .............................................. G06F 11/10
[52] U.S. Cl. ................... 235/153 AM; 340/146.1 AG
[58] Field of Search ............ 340/146.1 AG, 146.1 AJ; 235/153 AM

[56] References Cited

U.S. PATENT DOCUMENTS

| 3,242,461 | 3/1966 | Silberg et al. ............. 340/146.1 AG |
| 3,519,988 | 7/1970 | Grossman ................... 340/146.1 AG |
| 3,569,934 | 3/1971 | Parr, Jr. ...................... 340/146.1 AG |
| 3,831,144 | 8/1974 | En ................................ 340/146.1 AG |
| 3,876,978 | 4/1975 | Bossen et al. ................. 235/153 AM |
| 3,887,901 | 6/1975 | Moore ........................ 340/146.1 AG |

*Primary Examiner*—Charles E. Atkinson
*Attorney, Agent, or Firm*—John S. Solakian; Ronald T. Reiling

[57] ABSTRACT

A memory having a plurality of word locations, each having a bit location, includes a parity word in one of the word locations. Bit selector means selects a column of bits made up of like positioned bits in each of the word locations. All bits in a column are added together to indicate whether there is a successful parity check. Each such column is successively checked thereby verifying the integrity of the stored information on a column basis.

13 Claims, 20 Drawing Figures

Fig. 17. RESUME INTERRUPT ROUTINE

4,038,537

APPARATUS FOR VERIFYING THE INTEGRITY OF INFORMATION STORED IN A DATA PROCESSING SYSTEM MEMORY

BACKGROUND OF THE INVENTION

The present invention generally relates to data processing systems and more particularly to apparatus used in the control and operation of one or more peripheral devices.

The interface between a data processor and a plurality of peripheral devices has been accomplished in many different ways. As electronic logic element functionality and capabilities increase, the economies provided enable data processing system architecture to improve correspondingly. Such improved architecture may include for example the versatility of a microprogrammed control store element, as well as a so called scratch pad memory for use in storing control and status information for use in control of the devices. For a device controller, versatility and flexibility is important, and accordingly the controller should not only include apparatus by which the control store enables the operation of such controller and devices, but it should also be able to respond to instructions received from a central processor so as to facilitate processor controlled diagnostic operations. Further, the architecture should enable the more often repeated instructions to be processed, even at the expense of some additional logic, in the least time possible. Similarly, for certain often repeated arithmetic operations, such as for example that associated with the storage of information in the so called scratch pad memory, the architecture must provide for the processing to take place as quickly as possible. The system should also include efficient means by which the integrity of the information stored therein, including the instructions in the control store, be verified, and further, the controller must have the versatility to interface with a plurality of different device types. It must be able to control the operation of such different device types automatically and independent of the so-called channel by which the controller is coupled with the devices. In addition, the controller should include efficient means for addressing not only the microprogrammed control store, but also the so-called scratch pad memory.

It is accordingly a primary object of the present invention to provide improved apparatus for use in a data processing system, which apparatus is useable in controlling the operation of a plurality of peripheral devices.

SUMMARY OF THE INVENTION

The objects of the present invention are achieved by providing a system comprising apparatus for storing information which includes a plurality of word locations, each for storing a word, each of the word locations including a plurality of bit locations, each for storing a bit, wherein the bit locations in the same position in each of the word locations form a column of bit locations and wherein one of the word locations includes a parity bit in each of the bit locations to indicate the integrity of information on a column basis. The system further comprises apparatus for sequentially accessing words in each of the word locations in the storage apparatus and a column selector for accessing one bit in the same bit location for each of the words accessed from the word locations thereby selecting one of the columns for the purpose of indicating the integrity of the contents thereof. Further, provided is apparatus for adding the value of the accessed bits for the same bit locations in each of the accessed words until all of the bits in one column identified by the same bit location are added together thereby generating a final value in response to which there is included an apparatus for detecting whether the final value indicates an error condition.

BRIEF DESCRIPTION OF THE DRAWINGS

The above and other objects of the invention are achieved in the illustrative embodiment as described with respect to the figures in which.

DETAILED DESCRIPTION OF THE PREFERRED EMBODIMENT

The basic device controller (BDC) of the present invention, in conjunction with configurable device adapters, is a microprogrammed peripheral controller which attaches a data processor's bus such as that described in U.S. patent application Ser. No. 591,902, filed on June 30, 1975. The controller provides, by way of example, simultaneous control of any four of the following device types: a line printer, a serial printer, a card reader, a console, or a diskette. The BDC is generalized to facilitate its application as a peripheral controller for several low performance device types. Device specific functionality is provided by device adapters and by segments of the BDC firmware. Device adapters typically support one device. Irrespective of the configuration of adapters and devices, each device represents an addressable channel which includes the device, adapter, and the BDC. Thus, each BDC has as many addressable channels as there are devices or device ports. The BDC multiplexes channel activity giving highest priority to channel 1 and to bus transfers, lowest priority to channel 4 and retired interrupts. Channel operations are independent, except for clear and diagnostic mode. When put in diagnostic mode, the BDC clock halts and the BDC control store is disabled. Each successive bus transfer to the BDC generates one clock cycle during which the data contents of the bus cycle are executed as a microinstruction.

Figure 1:
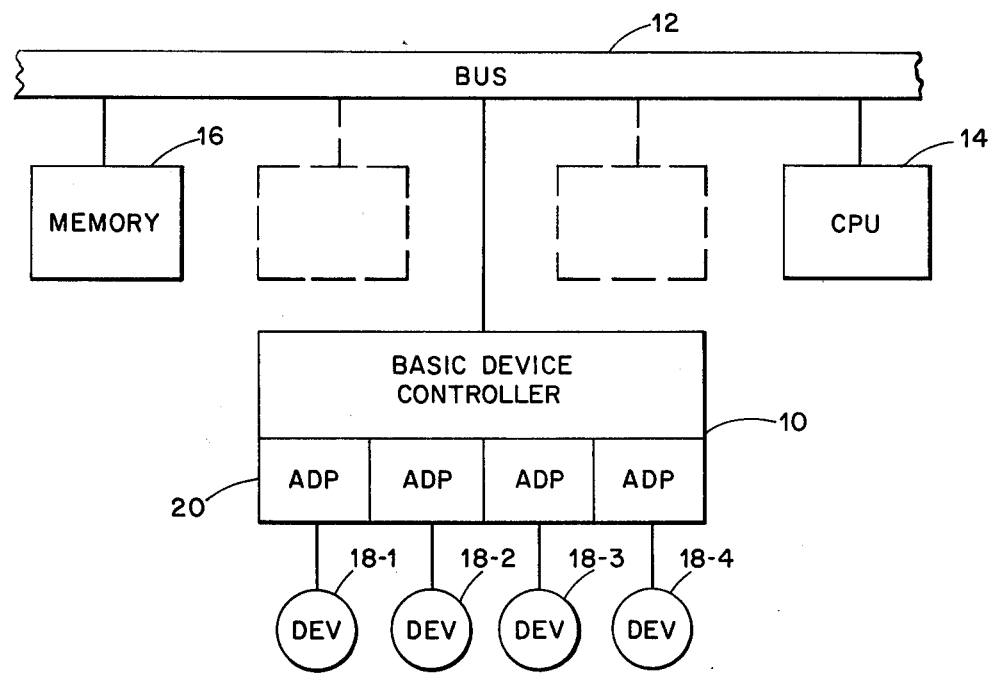
FIG. 1 is a general block diagram illustrating the environment of the present invention.

FIG. 1 is a general block diagram illustrating the environment of the basic device controller 10 of the present invention. Controller 10 is coupled to a bus 12 which may be common to all elements in the system including a CPU 14 and a memory 16. The controller 10 may for example service up to four devices 18 via device adapter 20.

Figure 2:
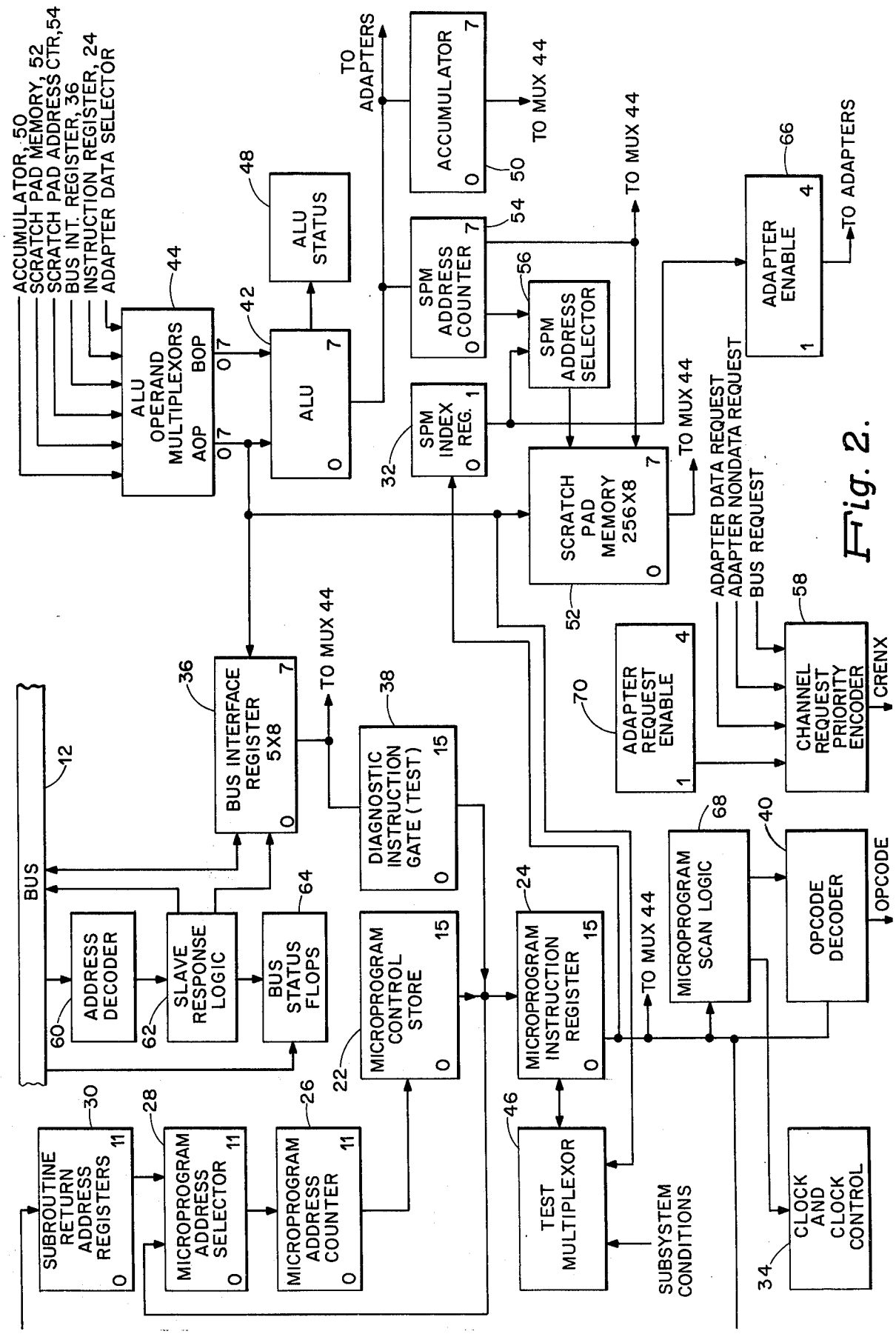
FIG. 2 is a block diagram of the controller of the present invention.

Now referring to FIG. 2 there is shown a block diagram of the controller of the present invention. The BDC may be classified as a vertical microprocessor because it has a narrow word and one microinstruction per word. The microprogram control store (UPCS) 22 is 16 bits wide and is expandable to a maximum of 4K words. This amount of addressability is sufficient to permit the use of a single prom package to support all device types that may be connected to the BDC. The UPCS 22 is enabled during normal operation when the BDC is not in diagnostic mode. At the outset it should be stated that the size, width, capacity of various elements described is by way of example, and in no way limits the invention. Also, references to various elements, processes, such as diagnostic mode will be hereinafter described.

The output of the UPCS 22 is clocked into the microprogram instruction register (UPIR) 24 at the leading edge of each clock cycle for execution. The microprogram address counter (UPAC) 26 is also clocked at the leading edge of every clock cycle. Thus, as one microinstruction is stored in the UPIR 24 for execution, the UPAC 26 changes to access the next microinstruction from control store 22. During the execution of inline firmware code, the microprogram address counter (UPAC) 26 increments by one in order to access instruction n + 1 concurrently with the execution of instruction n. When a branch command is executed however, the increment function is inhibited and the UPAC 26 is loaded with the output of the microprogram address selector (UPAS) 28. In order to speed the execution of firmware routines, branch commands are executed in one clock cycle by decoding GO TO and RETURN BRANCH commands from the output of control store; all other commands are decoded from the output of the instruction register 24.

When GO TO commands are decoded, the UPAS 28 selects the low order 12 bits of control store as the next address, causing a direct branch to the address specified by the microinstruction. If a RETURN BRANCH is decoded, the UPAS 28 selects the output of the subroutine return address register (SRAR) 30 as the next address. The SRAR 30 consists of four address registers (one per channel), which are used by firmware for storing return addresses when branching to a subroutine. The SRAR 30 is addressed by the scratch pad memory index register 32 which means that the location of the SRAR 30 being read or written corresponds to the channel that is currently active. Data to the subroutine return address registers 30 is from the UPIR 24 and is loaded by firmware command.

There is no interrupt mechanism in the BDC 10, save for master clear which forces the microprogram address counter 26 to location zero of control store 22. All other branch and address operations are done by firmware control. When the BDC is in diagnostic mode, the microprogram control store 22 is disabled and the BDC clock 34 is stopped. Each successive bus transfer to the BDC generates one clock cycle in which the data segment of the bus interface register 36 is loaded in the microprogram instruction register 24 via the diagnostic instruction gate (TEST) 38 and executed as a microinstruction. The diagnostic instruction gate 38 gives diagnostic software the capability of loading and executing fault isolation firmware routines in the BDC via the bus 12.

The output of control store 22 or the diagnostic instruction gate 38 is stored in the microprogram instruction register 24 for execution. The 3 high order bits of each microcode are coded to indicate the type of command. The opcode decoder (OPCOD) 40 performs a 3 to 8 binary decode of the 3 high order bits of the instruction register 24. The 8 outputs of the opcode decoder 40, coupled with other bits in the instruction register 24 are distributed throughout the BDC to control hardware operation. Additionally, firmware instructions are decoded and distributed to device adapters. Device adapter commands are executed only by the device adapter which is enabled and are ignored by those adapters which are not enabled.

The arithmetic logic unit (ALU) 42 and the ALU operand multiplexors 44 are the focal point of all data operations within the BDC and between the BDC and device adapters. Operand multiplexors included in multiplexors 44, consist of an A operand multiplexor (ALUAX) which selects one of eight visible registers as the A input to the ALU 42, and the B operand multiplexor which selects one of four registers as the B input to the ALU 42. In addition to the ALU 42, the data out of the A operand multiplexor goes to the test multiplexor 46 for bit testing of data fields. The data out of the B operand multiplexor goes only to the ALU 42. The ALU performs 8 bit arithmetic and logic operations on the selected A and B operands with the result of the operation being loaded in a receiving register, depending on the coding of the microinstruction.

Status generated during ALU commands is stored in ALU status flops 48 until the next ALU commamd. ALU status indicating carry out, an all ones result or an all zeros result is made visible to firmware via the test multiplexor (TSTMUX) 46. The ALU 42 is also used for performing bit operations on A operands with a data constant which is specified by the instruction register 24 and selected by the B operand multiplexor. A operands can also be loaded via the ALU 42 with a constant specified by the instruction register 24 and selected by the B operand multiplexor. Alternatively, firmware can perform word mode arithmetic operations which forces a carry in to the ALU equal to the carry out of the previous ALU command. This capability is used to operate on multiple byte data fields such as memory addresses.

The accumulator (ALUAC) 50 is an 8 bit register which can be used for temporary storage of ALU output. In addition, the contents of the accumulator can be right shifted one bit position at a time, with the shift input being zero. Although right shift operations can only be performed by the accumulator 50, left shift operations can be performed by the ALU 42 on any A operand.

The BDC uses a 256 × 8 scratch pad memory 52 for storing data, status, commands, etc. Data being written in memory 52 is from the ALU A operand multiplexor which allows any visible register to serve as an input local register. The data out of memory 52 goes to the A and B operand multiplexors. The scratch pad memory address counter (SPMAC) 54 is an 8 bit counter which can be incremented or loaded with the result of an ALU operation. The output of SPMAC 54 goes to the A and B operand multiplexors. The 6 low order bits out of the SPMAC 54 go directly to address scratch pad memory 52, while the 2 high order bits go to the scratch pad memory address selector (SPMAS) 56. The scratch pad memory index register 32 is 2 bits wide and can be loaded by firmware with a specific value included in control store 22 or with the output of the channel request priority encoder 58. The contents of index register 32 specify the channel that is active and are used to address the return register 30, to enable device adapters, nd to index scratch pad memory 52.

The scratch pad memory address selector 56 is a 2 to 1 multiplexor which selects the contents of the index register 32 or the two high order bits of the address counter 54 as the 2 most significant address bits of scratch pad memory 52. During the execution of functional firmware the scratch pad memory index control flop, as hereinafter described, is normally one, causing the address selector to output the contents of the index register 32. Each quadrant of scratch pad memory 52 is dedicated to a particular channel. Scratch pad memory addresses generated by functional firmware are indexed by the number of the channel that is active.

Bus logic provides a common interconnection between the bus 12 and each channel of the BDC 10. Although some logic signals such as channel ready are dedicated to a particular channel, the majority of bus hardware is common to all channels of the BDC. Bus cycles to the BDC are detected by the address decoder 60 which enables the slave response logic 62. If the addressed channel has a device and a device adapter installed, an ACK, NAK or WAIT response will be generated; no response will be given by the BDC if an adapter is not installed. If a NAK condition does not exist, and if the bus logic is not busy, then bus transfers to a channel having an adapter installed will be ACK'd. Any ACK response by the BDC to a bus transfer causes information on the address and data lines to be stored in the bus interface register 36. In addition, the state of certain control lines is stored in bus status flops 64 and, the bus logic is made busy which inhibits further transfers to the BDC. The nature of the ACK, NAK, etc. responses as well as details of the bus logic may be found in the aforementioned patent application.

When firmware wants to transfer information to the bus 12, it sets the bus logic busy and then proceeds to load the bus interface register 36 and control logic with necessary data before initiating a bus cycle. The status of the slave's response, except for a WAIT response, are stored in the bus status flops 64, and the bus logic remains busy until firmware recognizes the completion of the bus cycle and dispenses with status. The bus logic busy flop serves to synchronize utilization of bus logic by the BDC firmware and by other units on the bus. Another flop is set when the bus logic generates an ACK response; its output generates a bus request signal to the Channel Request Priority Encoder 58.

Each device adapter provides a data request signal and a non data request signal to the channel request priority encoder 58. The data request signal is used to indicate the presence of a data byte read from the device or the need for a data byte to be written to the device. The non data request signal may be used to indicate a change in device state. Each adapter generates one data request signal and one non data request signal per channel. The channel request priority encoder 58 indicates when a channel request is active. It also prioritizes the channel requests such that any bus request has priority over any data request which has priority over a non data request. In addition, a request from channel 1 has priority over a similar request from channel 4.

In order to immunize the BDC from faulty device requests, adapter request enable flops 70 are set by firmware if a valid device i.d. code is recognized during initialization. The request enable flops remains reset if a device is not supported. Firmware tests the channel request output of the priority encoder 58 to ascertain if a bus request or adapter request has occurred. It can further test the priority encoder 58 to determine if the request having highest priority is a bus request or data request. The absence of a bus request and data request implies a non data request has priority. The channel request priority encoder 58 also has 2 signals which equal the number of the channel having highest priority. These 2 signals are loaded into the index register 32 prior to the time a channel request is serviced. The contents of the index register 32 are decoded by the adapter enable logic 66 which enables one adapter at a time, except during master clear, when all adapters are enabled.

Subsystem conditions including status, error and register bits are visible to firmware via the test multiplexor 46. Test and skip operations by firmware specify a signal and signal condition for which a skip should occur. The test multiplexor 46 compares the state of the specified signal with the specified signal state and disables the microprogram instruction register 24 for one cycle if the two are equal.

Several tests performed in the system include the basic logic test which consists of a hardware scan by means of scan logic 68 of the microprogram control store 22 followed by a firmware basic logic test. The scan logic 68 performs a longitudinal redundancy check on each bit position of control store, insuring that the bit sum of each location is even. If no error is detected at the end of a scan, the hardware continues to the next bit position until all bit positions have been checked. The scan logic 68 stops clock 34 if an error is detected.

Figure 3:
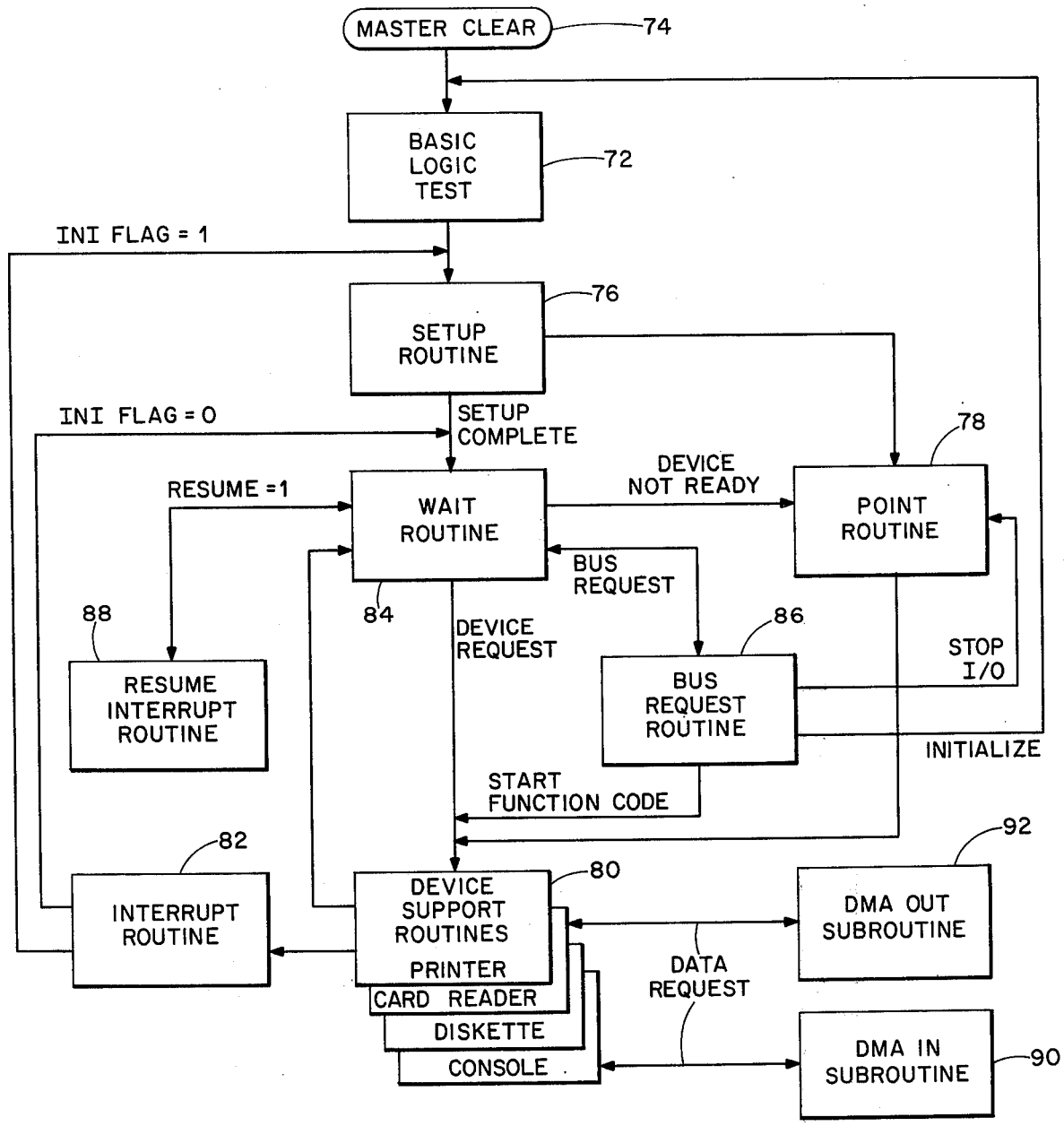
FIG. 3 is a block diagram of the operation of the controller of the present invention.

The following describes the firmware of control store 22 which is shown in the block diagram of FIG. 3. The basic logic test (BLT) 72 is a firmware routine that functionally verifies major logic components of the BDC to determine if the BDC is operational. Device adapters are not verified by the BLT 72.

The basic logic test is executed whenever a master clear 74 occurs, which resets the BLT done flip-flop and forces the microprogram address counter 26 to zero. Firmware sets the BLT done flop upon the successful completion of the test. BLT is also executed when the initialize bit is set in an output control word.

The setup routine (setup) 76 is executed following the completion of the basic logic test. The first segment of the setup routine initializes scratch pad memory 52, and is used as a subroutine by the BLT. The second segment of the setup routine 76 enables one adapter at a time and branches to the point subroutine 78. Following the execution of the point subroutine 78 and device support routine 80, the interrupt routine 82 branches back to the setup routine 76 which enables the next adapter. After all adapters have been enabled and setup, the setup routine branches to the wait routine 84.

The wait routine (wait) 84 tests the channel request priority encoder 58 and the resume interrupt flip-flop to determine what firmware action is required. If a channel request is active, the wait routine 84 loads the scratch pad memory index register 32 with the number of the requesting channel having highest priority, thereby enabling BDC logic and the device adapter associated with that channel. After loading the channel number, the wait routine branches to the bus request routine 86 if a bus transfer to the BDC has occurred, otherwise, it returns to the device support routine 80 as long as the device is ready. If there are no channel requests, the wait routine 84 tests the resume interrupt flop and branches to the resume interrupt routine 88 if the flop is set. The wait routine 84 waits until a channel request occurs or until the resume interrupt flop sets and performs no other function than prioritizing the execution of channel requests.

The wait routine 84 loads the requesting channel number and branches to the bus request routine 86 when it detects a bus transfer to the BDC. Since the DMA in and out subroutines 90 and 92 respectively, interrupt routine 82 and resume interrupt routine 88 complete all bus transfers which they initiate, the bus transfer which caused the request is an unsolicited bus cycle which was initiated by the CPU 14. If no response is required, the bus request routine 86 stores pertinent information from the data and address segments of the bus interface register 36 in scratch pad memory 52 using the function code as the low order 6 bits of the address. The data is then decoded, causing the bus request routine 86 to branch to the setup routine 76, basic logic test 72, device support routine 80 or back to the wait routine 84, depending on the function code and contents of the data field. If a response is required, the bus request routine 86 access scratch pad memory 52 using the function code and index register 32 as an address. Data from scratch pad memory 52 is loaded in the bus interface register 36 and the response cycle is completed before the bus request routine 86 branches back to the wait routine 84.

Device support routines 80 branch to the interrupt routine whenever a potential interrupt condition is detected or whenever initialization has occurred. The interrupt routine 82 tests the initialization flag and, if set, branches to the setup routine 76 whereupon the setup routine proceeds to setup the next device. If initialization has not occured, the interrupt routine will generate an interrupt as long as the interrupt level is not zero. Data to be used during the bus cycle is stored in scratch pad memory 52 for use by the resume interrupt routine 88, and the interrupt pending flag is set if the interrupt is NAK'd by the CPU. After completion, the interrupt routine 82 branches back to the wait routine 84.

The wait routine 84 branches to the resume interrupt routine 88 whenever there are no channel requests and the resume interrupt flop is set. Upon completion the resume interrupt routine branches back to the wait routine. The resume interrupt routine 88 enables each adapter in turn, and retransmits interrupts that have been previously NAK'd. No activity occurs if a channel does not have an interrupt pending, as determined by the interrupt pending flag in the channel monitor byte. The resume interrupt routine sets the channel ready flop and resets the interrupt pending flag if the retransmitted interrupt is acknowledged; the flag remains set and the channel remains busy (not ready) if the retransmitted interrupt is not acknowledged. All pending interrupts are retried, regardless of the CPU's response to earlier interrupts.

The point subroutine 78 has 2 entry points; one is used by the setup routine 76 and the other by the wait routine 84 and bus request routine 86. The entry point used by the setup routine sets the initialize flag in the channel monitor byte and then goes to the second entry point. The second entry point stores the device identification code in scratch pad memory 52, and then uses the device I.D. code to determine what type of device is connected to the adapter. If the device type is supported, the point subroutine 78 stores the startup function code associated with the device and loads the subroutine return address registers 30 with the starting address of the applicable device support routine 80. In addition, the point subroutine 78 sets the channel ready flop and enables device requests from that channel. The point subroutine then returns to the starting address it has loaded in the SRAR 30.

If a device is not supported, the point subroutine 78 loads the SRAR 30 with the starting address of the interrupt routine 82 and branches to the interrupt routine without enabling device requests from that channel.

The DMA subroutines 90 and 92 are used by the device support routines 80 for the purpose of transferring device data to or from main memory 16. Upon completion, the DMA subroutines return to the device support routines, using the SRAR 30 as an address. The DMA subroutines put or take one data byte from the accumulator 50 each time they are executed. When required, the subroutines initiate a bus cycle to main memory to read or write accumulated data. The subroutines also compute address and range, and signify end of range to the device support routine by setting the end of range flag in the channel monitor byte in scratch pad memory 52.

The firmware described to this point may be considered a general operating system which performs basic system functionally Device support routines, which may be considered as device handlers, provide device specific functionally. Both portions of firmware are required to fully support a given channel. An application of the device support routines is not pertinent to the understanding of the present invention.

Figure 4:
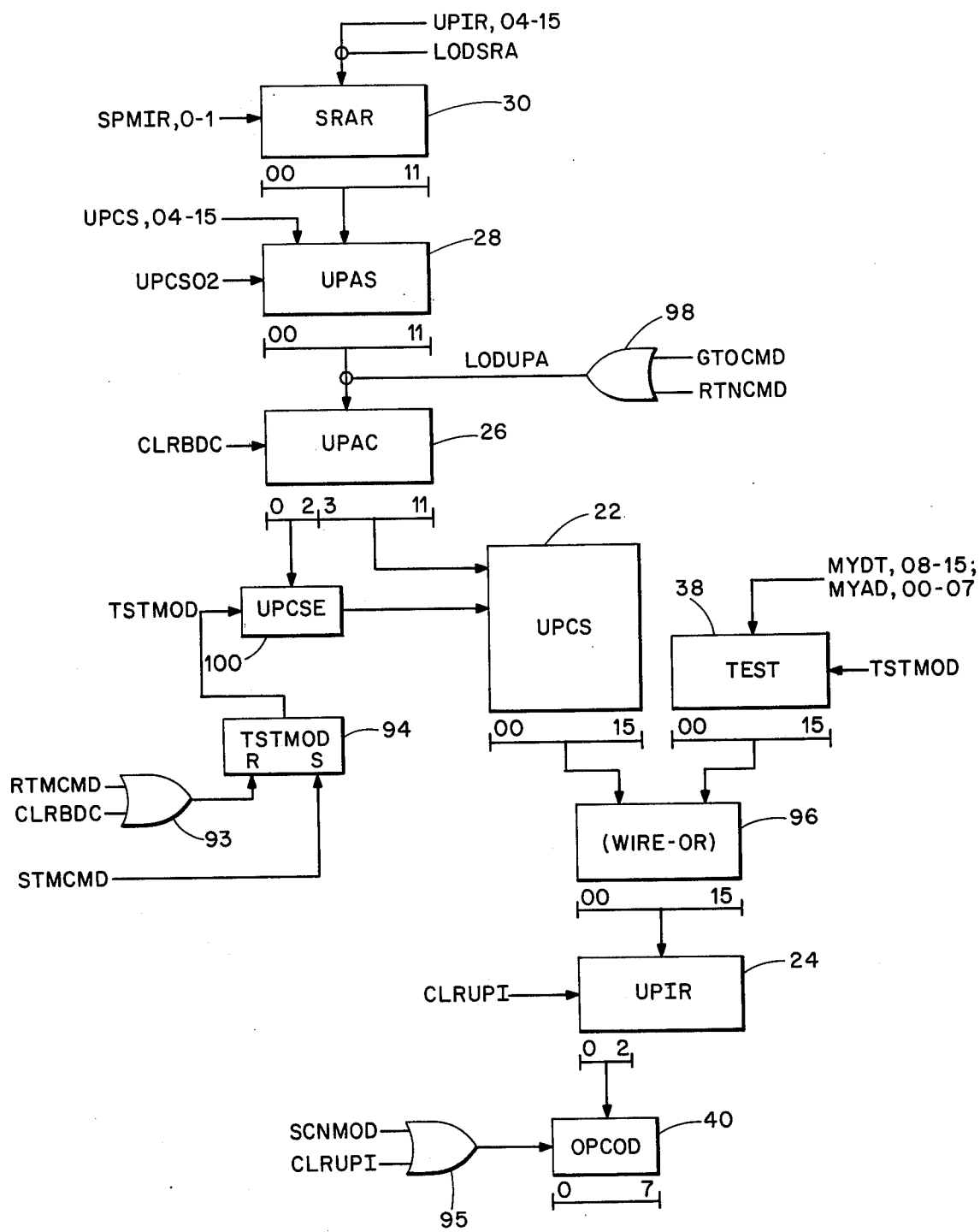
FIG. 4 illustrates the detailed logic utilized by the present invention during the access, storage and decode of microinstructions.

The access, storage and decode of microinstructions will now be more particularly described with reference to FIG. 4. The microprogram control store 22 is by way of example, 16 bits wide and is comprised of 2048 bit programmable read only memories (proms) having an array of 512 words by 4 bits. The UPCS 22 is expandable in 512 word increments to a maximum of 4096 words. The UPCS is enabled during normal operation when the BCD is not in diagnostic mode, as evidenced by the test mode flop (TSTMOD) 94 being reset via the signals received by OR gate 93. When a control word is received by the BDC specifying that the enter diagnostic mode, the bus request firmware executes a set test mode command (STMCMD) which sets the test mode flop 94. The TSTMOD flop being set puts the BDC clock in step mode and disables the control store 22. At the same time the diagnostic instruction gate 38 is enabled, which gates data from the bus interface register 36 to the control store "wire or" net 96. Any bus transfers to the BDC which occur after the TSTMOD flop 94 has been set will generate one clock cycle during which the data on the bus is transferred by the test gates 38 from the bus interface register 36 to the instruction register 24 and executed as a microinstruction.

The microprogram instruction register 24 is 16 bits wide and is used to store the output of control store 22 or the output of the test gates 38 for one clock cycle while the microinstruction is executed. The UPIR 24 is clocked at the leading edge of each clock by CLKSIG+ unless CLRUPI is active, forcing the register to zero. The signal CLRUPI is active during master clear and during cycles that are skipped because of a successful test instruction. The generation of these various signals and commands is discussed hereinafter.

The high order 3 bits of the instruction register 24 go to the opcode decoder 40 which performs a 3 to 8 bit binary decode, indicating which type of microinstruction is being executed. The decoder is enabled unless the BDC is performing a prom scan or unless the instruction register 24 is being cleared. A disable for these two conditions is received via OR gate 95. The 8 output signals from the opcode decoder 40, coupled with other bits in the instruction register 24, are used TO control the BDC and device adapter hardware. A description of command decoding is provided hereinafter. In order to speed the execution of firmware routines, branch commands are decoded using the output of control store 22 rather than the output of the instruction register 24. The address for GO To commands is also taken from control store 22. All other commands are decoded from the contents of the instruction register 24.

The microprogram address counter 26 is a 12 bit counter which increments by one at the start of every clock cycle unless the counter 26 is cleared by the signal CLRBDC which is active only when the BDC is initialized by a master clear. The counter is loaded when the signal LODUPA is active, which causes the UPAC 26 to preset to the address defined by the address selector 28. The LODUPA signal is active during the execution of a GO TO command (GTOCMD) and during the execution of a return branch command (RTNCMD), received by OR gate 98. The low order 9 bits of the UPAC 26 are used to directly address the proms of control store 22, while the high order 3 bits are fed to the microprogram control store enable (UPCSE) 100 which generates an enable signal for each possible row of proms.

The UPAS 28 selects one of two addresses for presetting the address counter 26. Bit 2 of control store 22 is high during a GO TO command, causing the address selector 28 to output a 12 bit address defined by bits 4–15 of control store 22. When UPCS02 is low, as for a return branch command, the address selector 28 outputs the 12 bit address defined by the return address register 30.

The SRAR 30 is a 12 bit register file having four locations, with one location dedicated to each channel. The location of the SRAR that is being read or written is determined by the contents of the index register (SPMIR) 32 which contains the number of the channel that is active at any given time. Firmware uses the return address register 30 to store an address which will be branched to at a later time by the same routine or by a subroutine. To store an address, firmware issues a load return address command which generates the write enable function LODSRA, causing the address defined by bits 4–15 of the instruction register 24 to be stored in the SRAR 30 at the location defined by SPMIR 32. When firmware does a return branch command, the contents of the location defined by the index register 32 are gated by the SRAR 30 to the address selector 28 and then to the address counter 26. In this manner, the return branch command causes the address counter 26 to preset to an address previously stored in the return address register 30.

Figure 5:
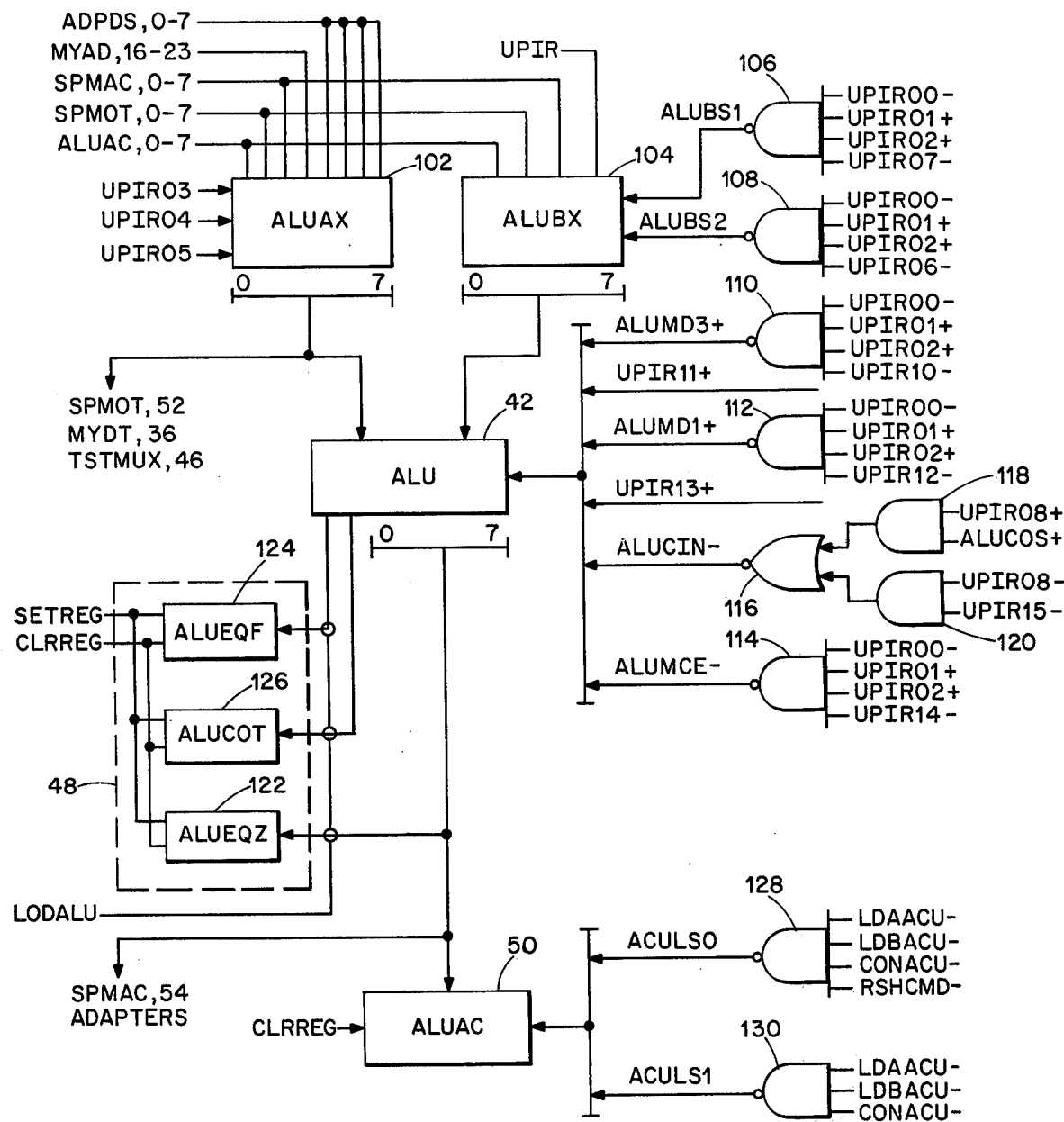
FIG. 5 provides detailed logic of the arithmetic unit and accumulator logic utilized in the controller of the present invention.

With reference to FIG. 5, the ALU 42 and accumulator 50 will now be more specifically described. The A operand multiplexor 102 selects one of 8 data fields according to a 3 bit address defined by bits 3–5 of the instruction register 24. For A operands equal to 4 through 7, the ALUAX 102 selects the output of the adapters' data selectors, which select one of 4 fields according to bits 4 1 and 5 of the instruction register 24. The output of the adapters' data selectors are wire or'd on the BDC and feed only to the A operand multiplexor 102. Only the adapter that is active will enable its data selector output. When an adapter is disabled, its data selector output goes to a high impedance state. The 8 bits output from the ALUAX go to the ALU 42, test multiplexor 46, scratch pad memory 52, and bus interface register 36.

The B operand multiplexor 104 selects one of 4 data fields as the B input to the ALU 42. The B operand is explicitly defined during ALU commands by bits 6 and 7 of the instruction register 24. For other commands, the default output of the B multiplexor is the instruction register, bits 6–10, 12 and 14–15, which define a data constant during constant commands. The address for the ALUBX 104 is generated by ALUBS1 and ALUBS2 received via NAND gates 106 and 108 respectively, which are enabled via the signals shown from register 24.

The ALU 42 performs an 8 bit arithmetic or logic operation using the data out of the A and/or B operand multiplexors. The type of operation that is prformed is determined by the mode signals, carry enable, and carry-input. The 4 mode signals, carry enable, and carry in are explicitly defined by the instruction register 24 during ALU commands which have an opcode of 3. Additionally, firmware may specify the carry input during arithmetic operations to be the carry out of the last ALU command, as defined by the state of flip flop ALUCOS. When an ALU command is not being executed, the signals ALUMD3+ (output of NAND gate 110), ALUMD1+ (output of NAND gate 112), and ALUMCE− (output of NAND gate 114) default to a one. The UPIR11+ and UPIR13+ ALU mode bits do not have a default state, thereby causing the default output of the ALU to vary according to bits 11 and 13 of the instruction register 24. Signal ALUCIN− generated via gates 116, 118 and 120, is a don't care for this operation. These 2 bits (UPIR11+ and 13+) are defined during constant commands and during device adapter commands causing the ALU to perform one of four operations.

The ALU data output goes to the accumulator 50, scratch pad memory address counter 54, and to amplifiers which feed the ALU output to the device adapters. In addition, each bit of the ALU output goes to a net of open collector invertors whose wired-and output provide the data for the ALUEQZ flop 122. This status flop, along with the ALUEQF 124 and ALUCOT 126 status flops, is clocked by the signal LODALU which occurs during ALU commands. In this manner, the ALU status flops set (or reset) when an ALU command is being performed, and remain valid for firmware testing until the next ALU command. The ALUEQZ and ALUEQF status flops indicate an all zeroes ALU output and an all one ALU output, respectively. The ALUCOT flop 126 indicates a carry out of the ALU 42 which, when the ALU is in subtract mode, can serve to indicate relative magnitudes of the A and B operands. For diagnostic purposes, each of the ALU status flops can be set independently of the ALU by the signal SETREG and reset independently of the ALU by the signal CLRREG. Both SETREG and CLRREG can be activated by firmware command; CLRREG is also active during master clear, causing the ALU status flops to be zero following master clear.

The accumulator (ALUAC or ACU) 50, which also resets with CLRREG, is an 8 bit register that is used for temporary data storage. The accumulator 50 can also perform right shift operations where the contents are shifted one bit position to the right with the shift input always zero. The operation of the accumulator is determined by the state of load select lines ACULSO (output of NAND gate 128) and ACULS1 (output of NAND gate 130), the clear signal CLRREG, and the clock signal CLKSTB. The output of the accumulator 50 goes to the A and B operand multiplexors, 102 and 104 respectively.

Figure 6:
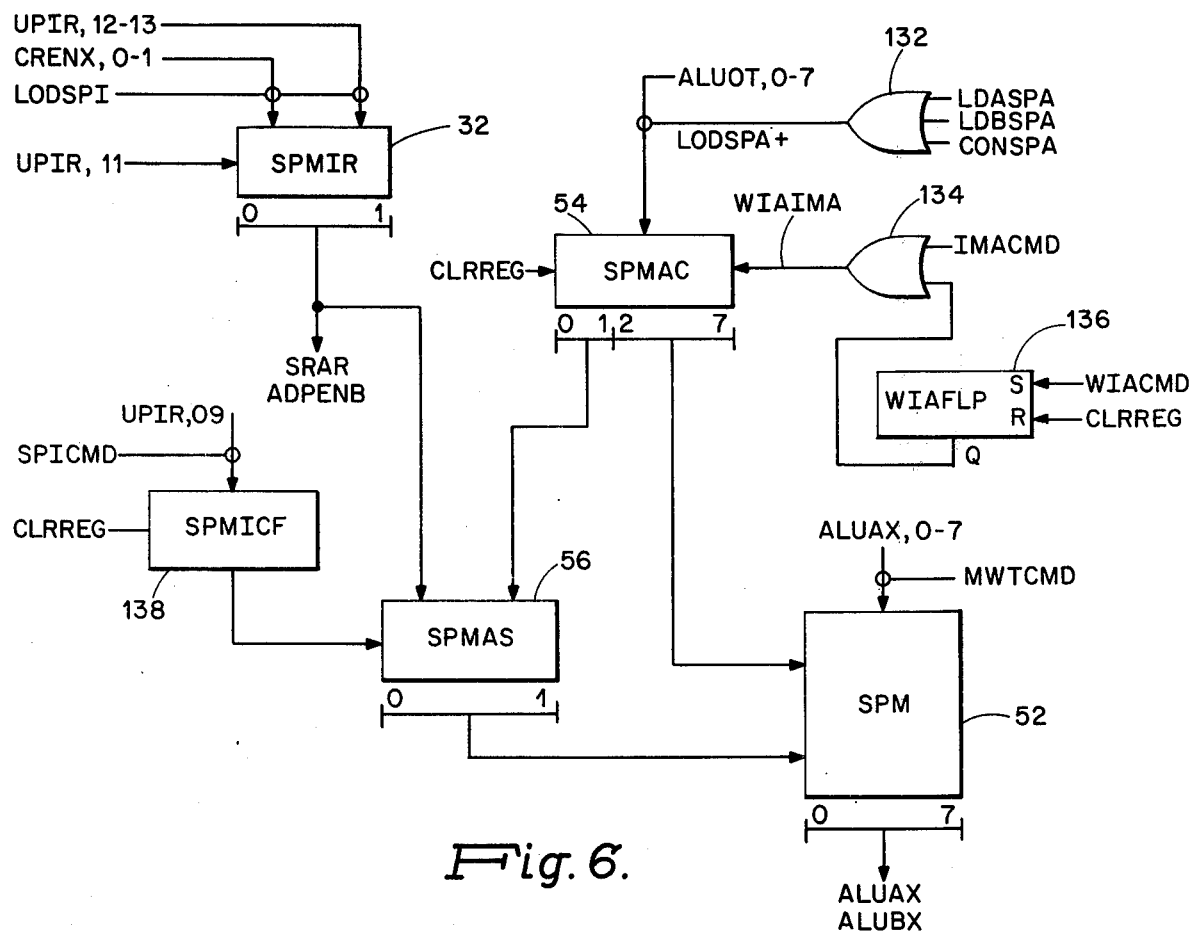
FIG. 6 illustrates the operation of the scratch pad memory utilized in the controller of the present invention.

The scratch pad memory 52 and the addressing thereof shall now be more particularly discussed with reference to FIG. 6. Scratch pad memory 52 is a 256 by 8 bit read/write memory which is used to store information that is required or generated by each channel. Data from the A operand multiplexor (ALUAX) 102 is written in scratch pad memory 52 during a memory write command (MWTCMD) at the location defined by bits 0 and 1 of the address selector 56 and bits 2 through 7 of the address counter 54. Since the input to the scratch pad memory is taken from ALUAX, any firmware visible register may be used as an input local register. The output from scratch pad memory 52 goes to the A and B operand multiplexors. The decode of a memory write command is anded with the clocksignal CLKSTB to produce the write pulse MWTCMD. This write pulse occurs just prior to the end of the cycle so as to guarantee data setup and hold times.

The SPMAC 54 is an 8 bit counter that can be loaded with the output of the ALU of incremented. ALU output (ALUOT) is loaded in the address counter 54 at CLKSTB whenever LODSPA (output of gate 132) is active. The LODSPA control signal is generated for those ALU commands that specify that the address counter be loaded with the ALU output (LDASPA and LDBSPA) and for constant commands which use the address counter 54 as the A operand (CONSPA).

The address counter 54 is incremented whenever the control signal WIAIMA (output of gate 134) is active at CLKSTB which causes the contents of the address counter 54 to increment by one. WIAIMA is generated during an increment memory address command (IMACMD) and when the WIAFLP flip-flop 136 is set. The WIAFLP flop sets during the execution of a write and increment address command (WIACMD) and resets one cycle following the command. In this manner, the address counter 54 increments one cycle after the write operation whenever a WIA command is executed. The control signal CLRREG resets the address counter to zero and resets the WIAFLP flop. The CLRREG signal is generated by master clear and by firmware command.

The SPM index control flop 138 is set or reset during a set or reset index command (SRICMD) according to the state of bit 9 of the instruction register (UPIR09). The flop also resets any time that CLRREG is active. The output of the SPMICF 138 determines the scratch pad memory address. When the index control flop 138 is reset, scratch pad memory 52 is addressed by the 8 bit contents of the scratch pad memory address counter 54. When the index control flop 138 is set, the scratch pad memory address is indexed by the contents of the index register 32. The index control flop 138 is normally on, except when firmware wants to address scratch pad memory 52 independently of the channel number that is enabled.

In one embodiment, the BDC can be configured with up to four devices. Although every device may be simultaneously busy, the BDC multiplexes channel activity, and uses the index register 32 to specify which channel is active at any given time. The contents of the index register 32 are used to address scratch pad memory 52 and the return address register 30 and also determine which adapter is enabled to execute firmware commands. The index register 32, which is 2 bits wide, can be loaded with a specific channel number (UPIR, 12-13) or it can be loaded with the channel number specified by the channel request priority encoder (CRENX, 0-1). The input to the index register is selected according to bit 11 of the instruction register (UPIR, 11) and is loaded whenever LODSPI is active.

The address selector 56 determines the 2 most significant bits of the scratch pad address. When the index control flop 138 is set, the SPMAS 56 selects the contents of the index register 32 as output. When the index control flop is reset, the address selector output equals the 2 high order bits of the address counter 54. Firmware normally indexes scratch pad memory 52, thereby dividing the memory into quadrants, one for each channel. Each quadrant of the scratch pad memory has the same topology, however, the activity in a quadrant may vary with the type of device connected to the channel.

The channel control of the BDC and adaptors shall now be more specifically discussed. A channel consists of the BDC, device adapter, and device. Complete channel control results from a combination of hardware and firmware. Channel ready flops are provided for each channel and are used to dynamically limit the availability of a channel. A channel is normally ready unless a device operation or an interrupt is in progress. The channel ready flops are all reset during master clear and remain reset until firmware readies the channel after the basic logic test. Any bus cycles to the BDC will be *nak'd* during this interval because the channel ready flop being reset will in most cases cause a NAK to bus cycles. The BDC can attach up to four devices, each of which may be simultaneously active. An adapter enable gate generates one enable signal for each channel using the contents of the scratch pad memory index register 32 to determine which adapter is to be enabled. Those adapters which are not enabled ignore all of the control functions on the BDC/ADAPTER interface and also disable their data selector outputs, thus allowing BDC firmware to communicate with a single adapter at any given time. The enable signals, then, limit the dialogue between the BDC and adapters to one adapter at a time, but in no way affect the dialogue between device and adapter.

Each adapter provides two signals to the BDC which indicate (1) that the adapter has a data request or (2) that the adapter has a non data or service request. Data and service requests are valid at all times, even when an adapter is not enabled, and are used to determine what channel activity is required by the BDC. Each channel has a flip-flop which firmware uses to enable adapter requests. These flops are individually controlled by firmware command, causing the flop to set or reset according to bit 15 of the instruction register 24. All of the adapter request enable flops are reset during master clear, which blocks all requests until such time that firmware sets the flop.

If enabled, the adapter request signals go to the channel request priority encoder 58. Bus request signals also go to the request encoder 58, and indicate that the BDC has acknowledged a bus cycle. The channel encoder 58 prioritizes channel requests, giving highest priority to bus requests, second priority to data requests, and lowest priority to service requests. The encoder also prioritizes requests of the same type by channel number, giving highest priority to channel 1 and lowest priority to channel 4. The output of the channel request priority encoder 58 indicates that a request is active, whether the highest priority is a bus request or data request, and the channel number of the highest priority request. A service request is indicated by the absence of a bus request or data request.

Figure 7:
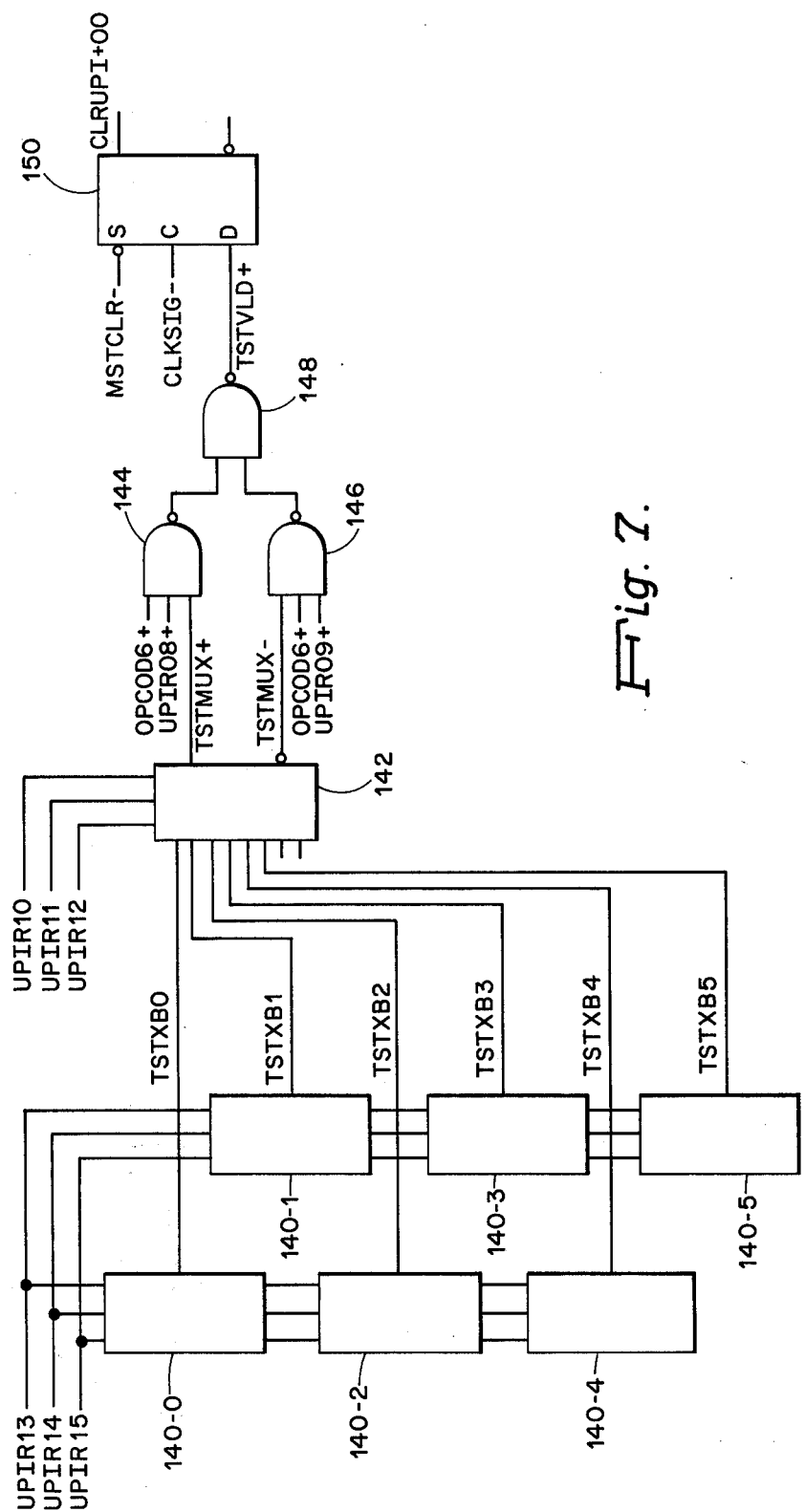
FIG. 7 illustrates the test multiplexer of the controller of the present invention.

Now referring to FIG. 7, the test multiplexor 46 shall be discussed. Firmware intelligence is derived from the capability of testing data, status and errors within the subsystem. Test commands specify a test item and a test condition. The next sequential command is skipped if the state of the test item equals the test condition. All test items go to one of the test multiplexors 140-0 to 140-5 whose outputs are respectively TSTXB0 through TSTXB5. These multiplexors use the 3 low order bits of the 6 bit field from register 24 that specifies the test item to select one of eight inputs. The high order 3 bits of the test item field are used to further select the test item by the TSTMUX multiplexor 142. The state of the test item, as defined by the outputs of TSTMUX multiplexor 142, is compared against the test condition as represented by the indicated bits from register 24, and the test valid signal (TSTVLD+) (generated by means of NAND gates 144, 146 and 148) goes high if the comparison is true. A valid test is recorded in the clear microprogram instruction flip (CLRUPI) 150 which clears the instruction register 24 during the next clock cycle. If the test is not valid, the instruction register 24 is not cleared, and the next sequential instruction is executed normally.

Figure 8:
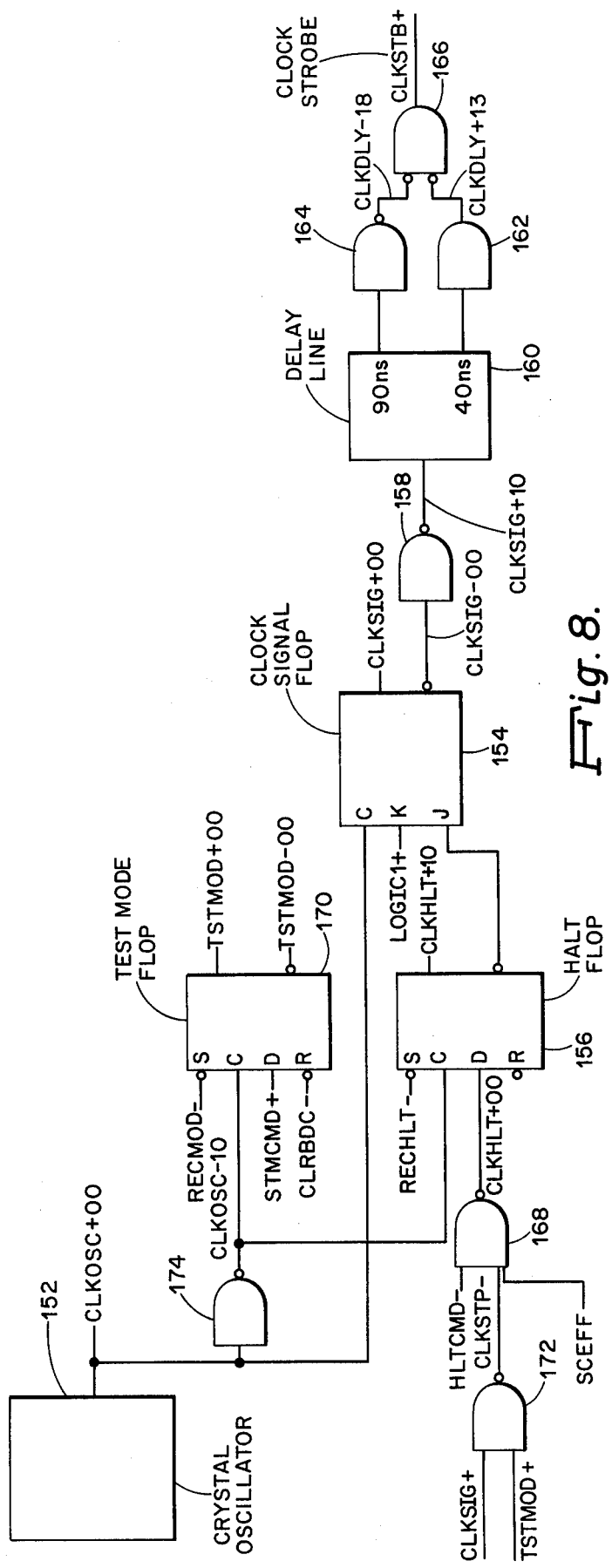
FIG. 8 illustrates the clock and clock control logic used in the controller of the present invention.
Figure 9:
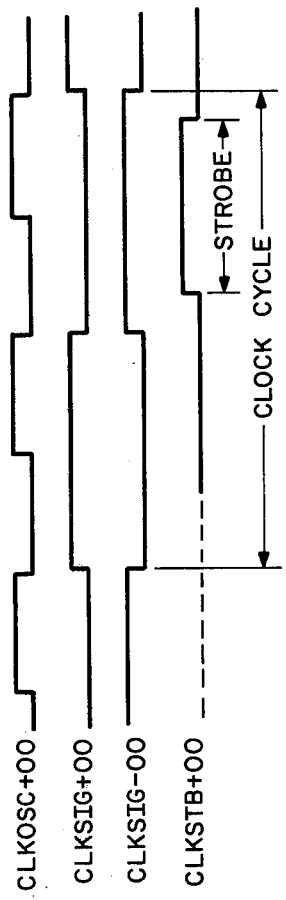
FIG. 9 illustrates the timing associated with the clock and clock control logic control logic of the present invention.

Now with reference to FIG. 8, the clock and clock control 34 shall be discussed. The clock and clock control waveforms are shown in FIG. 9. The output of an 8MHZ crystal oscillator (CLKOSC+00) is divided to obtain a 250ns clock cycle. Two clock signals (CLKSIG+00) and a clock strobe (CLKSTB+00) are developed during each clock cycle for controlling BDC and adapter hardware. The clock signal flop 154 is a JK flop which changes state at the negative edge of the CLKOSC+00 signal as long as the inputs are high. When the halt flop 156 is set, the J input goes low, causing the clock signal flop 154 to reset or remain reset. The negation clock signal (CLKSIG−00) is inverted (CLKSIG+00) via inverter 158 and fed to a tapped delay line 160 which may have a total delay of 100ns. The 40ns tap and the 90ns tap are used to generate a strobe (CLKSTB+00) via driver 162, inverter 164 and gate 166, which occurs during the latter part of every clock cycle. The strobe is designed to be a minimum of 35ns in width and to occur at a point in the cycle which will meet data set up and hold times sufficient for writing in scratch pad memory 52. The strobe is also used for clocking registers within the BDC and adapters. The BDC clock which runs uninterrupted during normal operation, is stopped whenever the halt flop 156 is on. The halt flop (CLKHLT+10) can be set by firmware when (1) detecting a critical error and stopping the BDC, when (2) entering test mode or (3) by hardware when a control store error is detected. For firmware, the halt flop is originally set by the execution of a halt command (HLTCMD−) received via NAND gate 168, which causes the CLKHLT+00 signal to go high. Except in test mode, the halt condition will be recirculated by the signal RECHLT− until a master clear occurs.

When the test mode flop 170 is on, however, the RECHLT− function goes inactive each time the BDC acknowledges a bus cycle. The next transition of the clock oscillator (CLKOSC−10) 152 causes the halt flop 156 to reset since CLKHLT+00 is low and RECHLT− is high. The halt flop 156 being reset puts a one at the J input to the clock signal flop 154 causing it to change state (SET) at the second transition of CLKOSC+00. The assertion clock signal CLKSIG+00 feeds back via NAND gate 172 to generate a high data input to the clock halt flop, causing it to set during the third transition of CLKOSC−10 genenerated at the output of inverter 174. In this manner, one clock cycle is generated during test mode for every bus transfer to the BDC. The test mode flop (TSTMOD+00) 170 is set by firmware command (STMCMD+) and remains set due to RECMOD− until a master clear occurs or until a command is received on the bus which causes test mode and halt flops to reset. In addition to controlling the stepping of the clock, the test mode flop 120 also controls the input to the microprogram instruction register 24. When set, the test mode flop 170 disables the prom and enables the test mode input to the instruction register 24.

Figure 10:
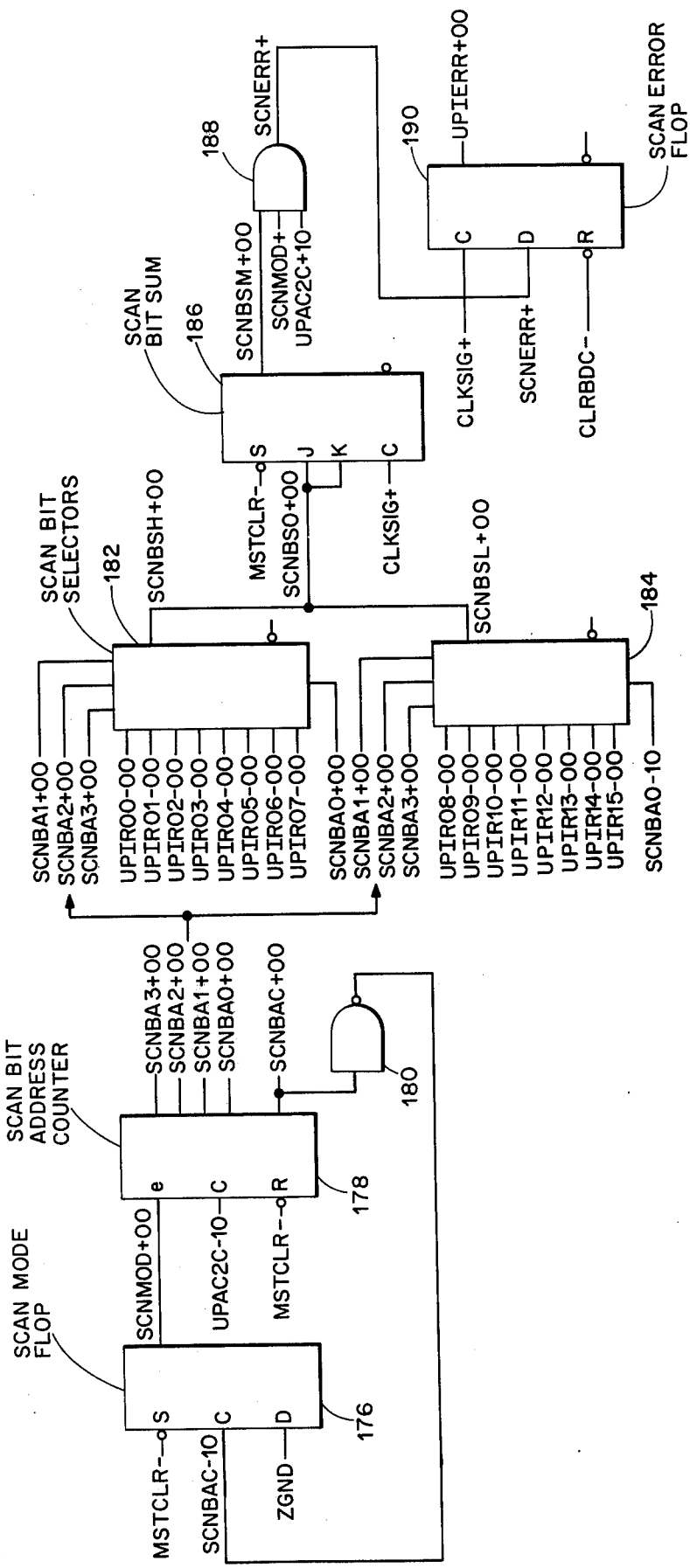
FIG. 10 illustrates the scan logic of the present invention.

Now with reference to FIG. 10, the scan logic 68 is incorporated in the BDC to insure the integrity of the microprogram control store 22. This logic performs a longitudinal check on each bit position of the control store 22 and will cause the BDC clock 34 to halt if an error is detected. If no errors are determined the BDC goes on to execute the firmware portion of the basic logic test. The scan mode flop (SCNMOD±00) 176 sets with master clear (MSTCLR−) which disables the opcode decoder 40 and inhibits all branch commands. With all commands inhibited, the BDC will load the instruction register 24 with the output of control store 22 and increment the address counter 26 to the next location of the control store 22 during each clock cycle. This process continues from location 000 to location FFF in control store 22 at which time there will be a carry out of the address counter (UPAC2C±) 26. The address counter 26 then returns to zero, beginning another scan through the control store. The scan bit selectors (SCNBSH±00; SCNBSL+00) 182 and 184 respectively, select one bit of the microprogram instruction register 24, using the output of the scan bit address counter 178 as an address. The selected instruction bit (SCNBSO+00) provides the J, K inputs to the scan bit sum flop (SCNBSM±00) 186. The SCNBSM+00 flop half adds the selected bit at the start of each clock cycle with its previous contents. At the end of one scan through control store 22, the scan bit sum flop 186 has added each location of control store 22 and the result should be zero, indicating that no error was detected. If the scan bit sum is not zero at the end of a scan, the scan error gate (SCNERR+00) 188 will be high and will set the scan error flop (UPIERR+00) 190.

The scan error flop 190 will cause the BDC clock to halt, and the contents of the scan bit address counter 178 will indicate which bit of the microprogram control store 22 is in error.

If an error is not detected at the end of a scan, the scan bit address counter 178 will increment due to the overflow of the microprogram address counter (UPAC2C-10) 26 and the microprogram address counter 26 will wrap around to location zero. The scan operation will repeat itself, but using the next bit of the instruction register 24 as J. K. inputs to the scan bit sum flop 186. The scan operation continues until an error is detected or until all bits have been checked, at which time the scan bit address counter 178 will overflow, producing the carry out SCNBAC+00 which will reset the scan mode flop 176. When the scan mode flop 176 resets, the opcode decoder 40 and branch commands are enabled, and normal execution of firmware begins.

The discussion of BDC firmware which follows will be easier to understand if it is remembered that scratch pad memory 52 is divided into quadrants, with one quadrant dedicated to a channel. The topology of each quadrant is the same, and is as follows (blank addresses are unused):

| ADDRESS | MNEMONIC | CONTENTS |
|---|---|---|
| 00 | CWD1 | Control Word, LSB |
| 01 | CWD2 | Control Word, MSB |
| 02 | ILC1 | Interrupt Level, LSB |
| 03 | ILC2 | Interrupt Level, MSB |
| 04 | SFC1 | Startup Function Code |
| 05 | | |
| 06 | TSK1 | Task, LSB |
| 07 | TSK2 | Task, MSB |
| 08 | ADR1 | Address, LSB |
| 09 | ADR2 | Address, MSB |
| 0A | MOD1 | Module, |

-continued

| ADDRESS | MNEMONIC | CONTENTS |
|---|---|---|
| 0B | | |
| 0C | RNG1 | Range, LSB |
| 0D | RNG2 | Range, MSB |
| 0E | | |
| 0F | | |
| 10 | CNF1 | Configuration Word 1, LSB |
| 11 | CNF2 | Configuration Word 1, MSB |
| 12 | CNF3 | Configuration Word 2, LSB |
| 13 | CNF4 | Configuration Word 2, MSB |
| 14 | | |
| 15 | | |
| 16 | | |
| 17 | | |
| 18 | STS1 | Status, LSB |
| 19 | STS2 | Status, MSB |
| 1A | | |
| 1B | | |
| 1C | | |
| 1D | | |
| 1E | | |
| 1F | | |
| 20 | DTA1 | Data, LSB |
| 21 | DTA2 | Data, MSB |
| 22 | | |
| 23 | | |
| 24 | MON1 | Channel Monitor |
| 25 | DMS1 | DMA Control |
| 26 | DID1 | Device I.D., LSB |
| 27 | DID2 | Device, I.D., MSB |
| 28 | DHN1 | Channel Number, LSB |
| 29 | CHN2 | Channel Number, MSB |
| 2A | CPC1 | CP's Address, LSB |
| 2B | CPC2 | CP's Address, MSB |
| 2C | IDF1 | Interrupt Vector, LSB |
| 2D | IDF2 | Interrupt Vector, MSB |
| 2E | WL01 | |
| 2F | WL02 | |
| 30 | WL03 | |
| 31 | WL04 | |
| 32 | WL05 | |
| 33 | WL06 | |
| 34 | WL07 | |
| 35 | WL08 | |
| 36 | WL09 | Working Locations |
| 37 | WL10 | |
| 38 | WL11 | |
| 39 | WL12 | |
| 3A | WL13 | |
| 3B | WL14 | |
| 3C | WL15 | |
| 3D | WL16 | |
| 3E | WL17 | |
| 3F | WL18 | |

Figure 11:
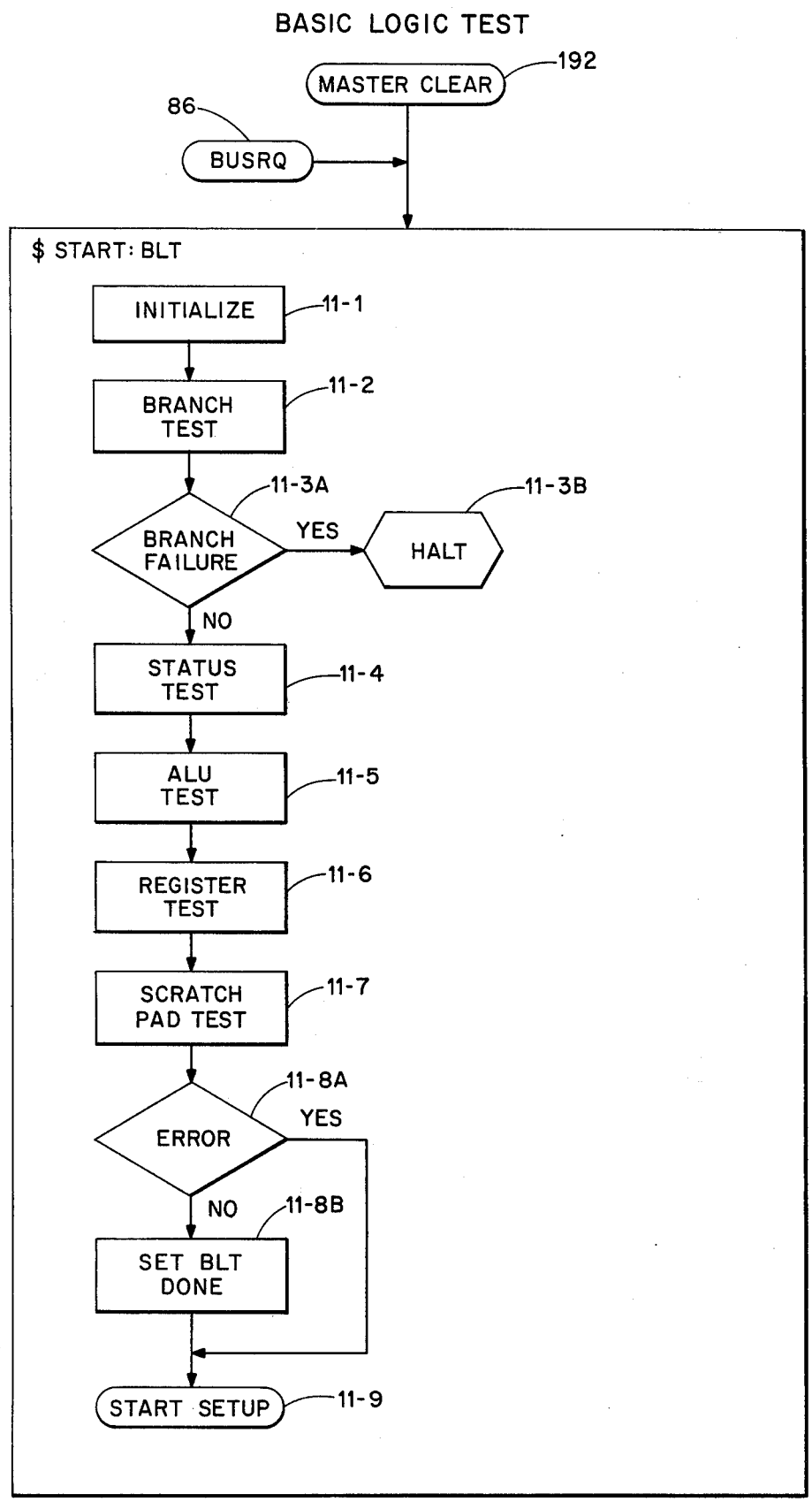
FIG. 11 is a flow diagram of the basic logic test provided by the control store and associated logic of the present invention.

Now referring to FIG. 11, the basic logic test 72 provided in combination with the firmware shall be discussed. The Basic Logic Test performs functional tests of hardware components in the BDC. Satisfactory completion of the BLT is evidenced by providing a signal which may be used to for example turn on or off a light such as a light emitting diode (LED). The basic logic test is started by a master clear 192 or by BDC firmware (bus request routine 86) upon detecting an initialize command in an output control word bus sequence. The BLT begins after hardware completes the scan check of microprogram control store 22 and performs the following functions. The following paragraph numbers correspond to the flow blocks in FIG. 11.

11-1. Initialize is performed in the event that the BLT was not invoked by a master clear. The initialize causes hardware to assume a power up or initialize state.

11-2. The branch test verifies the operation of the subroutine return address register 30, test multiplexer 46, microprogram address selector 28 and the microprogram address counter 26 by exercising test commands and branch commands.

11-3. A failure during the branch test will cause the BDC to halt, and will be evident by the illumination of the LED on the BDC board.

11-4. The status test uses test commands to verify that particular status and error flops were cleared during the initialize at step (1). The same flops are then set and checked for stuck at zero failures.

11-5. The ALU test uses the contents of the accumulator 50, which is reset during initialize to verify that the mode, carry enable and carry-in bits to the ALU 42 are not stuck at zero or stuck at one. The accumulator 50 is also checked during this test.

11-6. The register test uses a shifted ones pattern to test the accumulator 50, bus interface register 36 and scratch pad address counter 54 for storage and selection capabilities.

11-7. The scratch pad test starts with an all zero memory and writes an all ones pattern into one location. It then verifies that all other locations have remained zero and that the written location has retained the all ones byte. This adjacent word interference check is performed for each location of scratch pad memory 52.

11-8. Any error which is detected in steps 4 through 7 will cause the BDC to branch directly to the setup routine, by passing any remaining tests. If no errors are detected, the QLT command is executed which will cause the LED to extinguish.

11-9. The BLT goes to the setup routine unless a halt occurs during the branch test.

Figure 12:
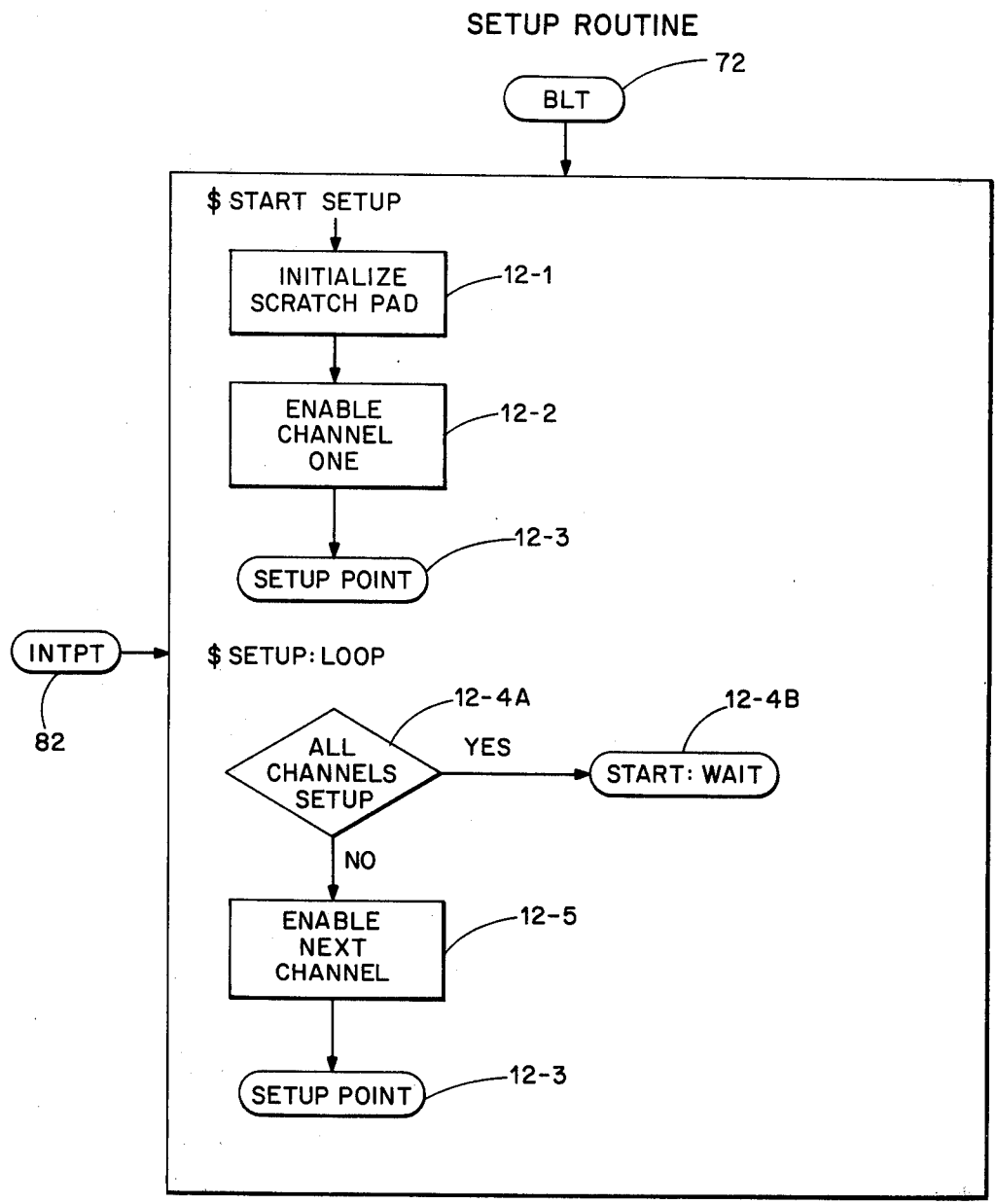
FIG. 12 is a flow diagram of the set-up routine provided by the control store and associated logic of the controller of the present invention.

The setup routine, the flow diagram of which is shown in FIG. 12, is initiated following the execution of the basic logic test 72. The object of the setup routine is to insure that each channel is interrogated by the point subroutine 78 for the purpose of identifying the device type connected to the channel and to establish those parameters required for channel activity. The functions performed by the setup routine are as follows:

12-1. A subroutine within the setup routine clears all of scratch pad memory. This subroutine, which will write all locations of memory with 00 or XX, where XX is specified by the user, is also used during the BLT scratch pad test.

12-2. Channel 1 is enabled by setting the index register 32. This enables the device adapter and addresses the subroutine return address register 30 and indexes the scratch pad address counter 54 (assuming index mode is on).

12-3. The setup routine branches to an exclusive portion of the point subroutine 78 which sets the initialize bit of the channel monitor flag byte.

12-4. The interrupt routine 82, on detecting the initialize flag set, will branch to the ($SETUP:LOOP) address of the setup routine. If all channels have been interrogated, the setup routine will branch to the wait routine 84.

12-5. The setup routine enables the next channel by loading the index register 32.

Figure 13:
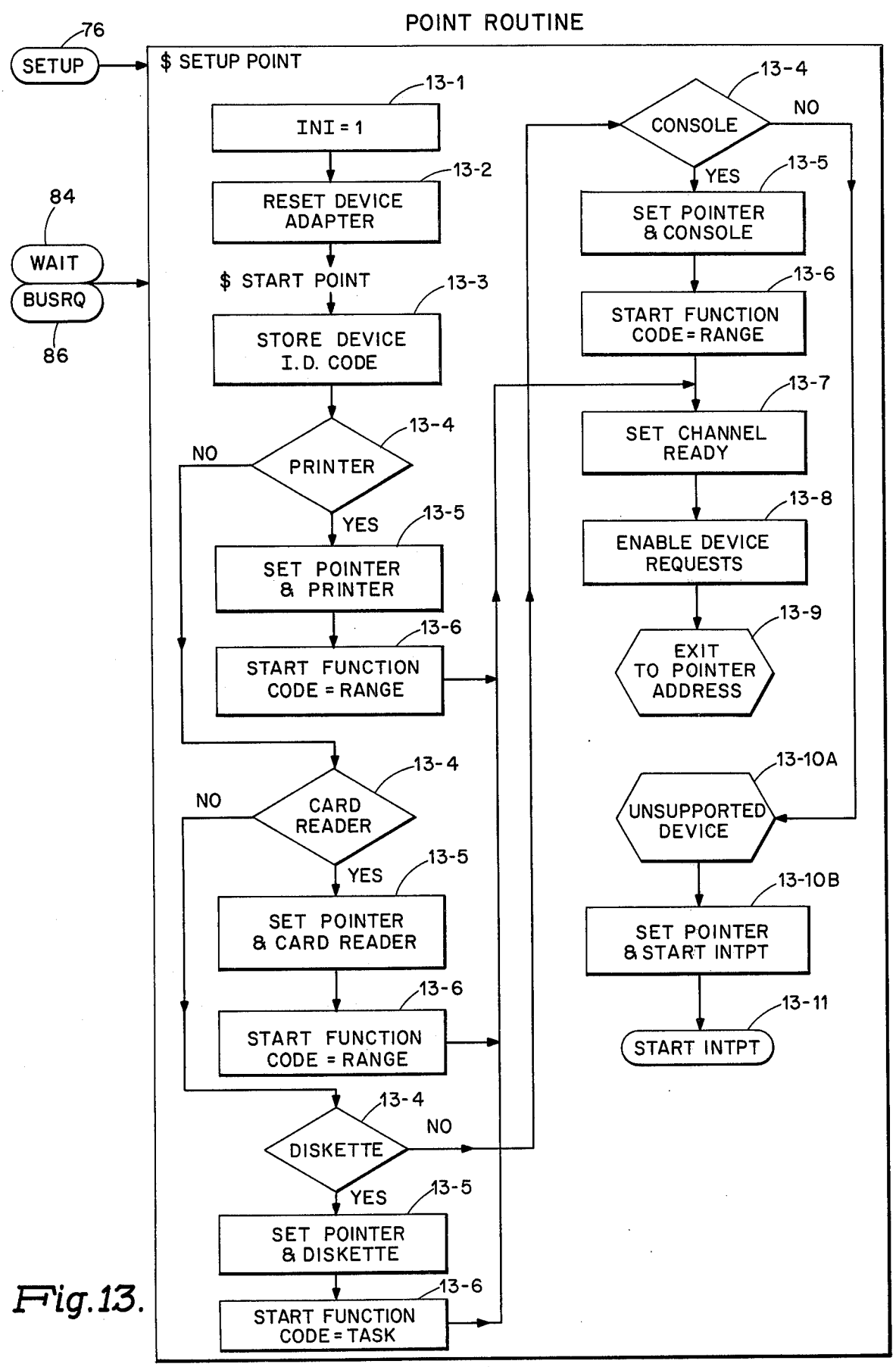
FIG. 13 is a flow diagram of the point routine provided by the control store and associated logic of the controller of the present invention.

Now referring to the point routine as shown in FIG. 13, the subroutine return address register 30 contains one location per channel which is used to store an address that points to a particular sequence in a device support routine 80. Initially, however, channel identify is unknown and channel pointers are considered invalid. It is the purpose of the point routine to establish channel identity and load the return address register 30 with the starting address of the device support routine 80 required by a given channel. Thereafter, the device support routine will maintain the pointer according to channel activity and device state until an initialize or stop I/O command is detected, at which time the point routine reinitializes the pointer. In addition to initializing channel pointers, the point routine performs other functionality as follows:

13-1. The setup routine branches to an exclusive address ($SETUP:POINT) in the point routine which sets the initialize bit of the channel monitor flag byte that is maintained in scratch pad memory 52. This bit being set insures that the interrupt routine 82 will branch back to the setup routine 76.

13-2. The device adapter that is enabled by the contents of the index register 32 is initialized.

13-3. The point routine stores the device i.d. code in scratch pad memory 52. Note that all scratch pad memory addresses used by the point routine are augmented by the contents of the index register 32. The wait routine 84 or firmware (bus request routine 86) enter the point routine here.

13-4. The device i.d. code is compared against known values to determine the identity of a channel. The comparison of the known i.d. for a device is repeated for each device type, i.e., printer, card reader, etc.

13-5. Once the identity of a channel is known, the subroutine return address register 30 is loaded with the starting address of the device support routine 80 required by that channel. The address of the SRAR 30 that is read or written is determined by the contents of the index register 32 even if the scratch pad memory 52 is not in index mode.

13-6. The startup function code used by a channel varies according to the device type, and is stored in scratch pad memory 52. The value of the startup function code is used by the bus request routine 86 to determine when a go command is received.

13-7. The channel ready flop is reset during master clear, causing the BDC to NAK any bus cycles to that channel. The channel ready flop is set by the point routine when it is known that the device connected to the channel is supported.

13-8. Device requests are disabled during master clear and are enabled if the device is supported.

13-9. The point routine exits by doing a return branch, loading the microprogram address counter 26 with the channel pointer defined in step (5).

13-10. The channel is not supported and its pointer is set to the interrupt routine 82. Device requests remain disabled and the channel ready flop remains reset, causing the BDC to NAK any bus cycles to that channel.

13-11. The point routine branches to the interrupt routine 82 which will find the initialize flag set and branch back to the setup routine 76.

Figure 14:
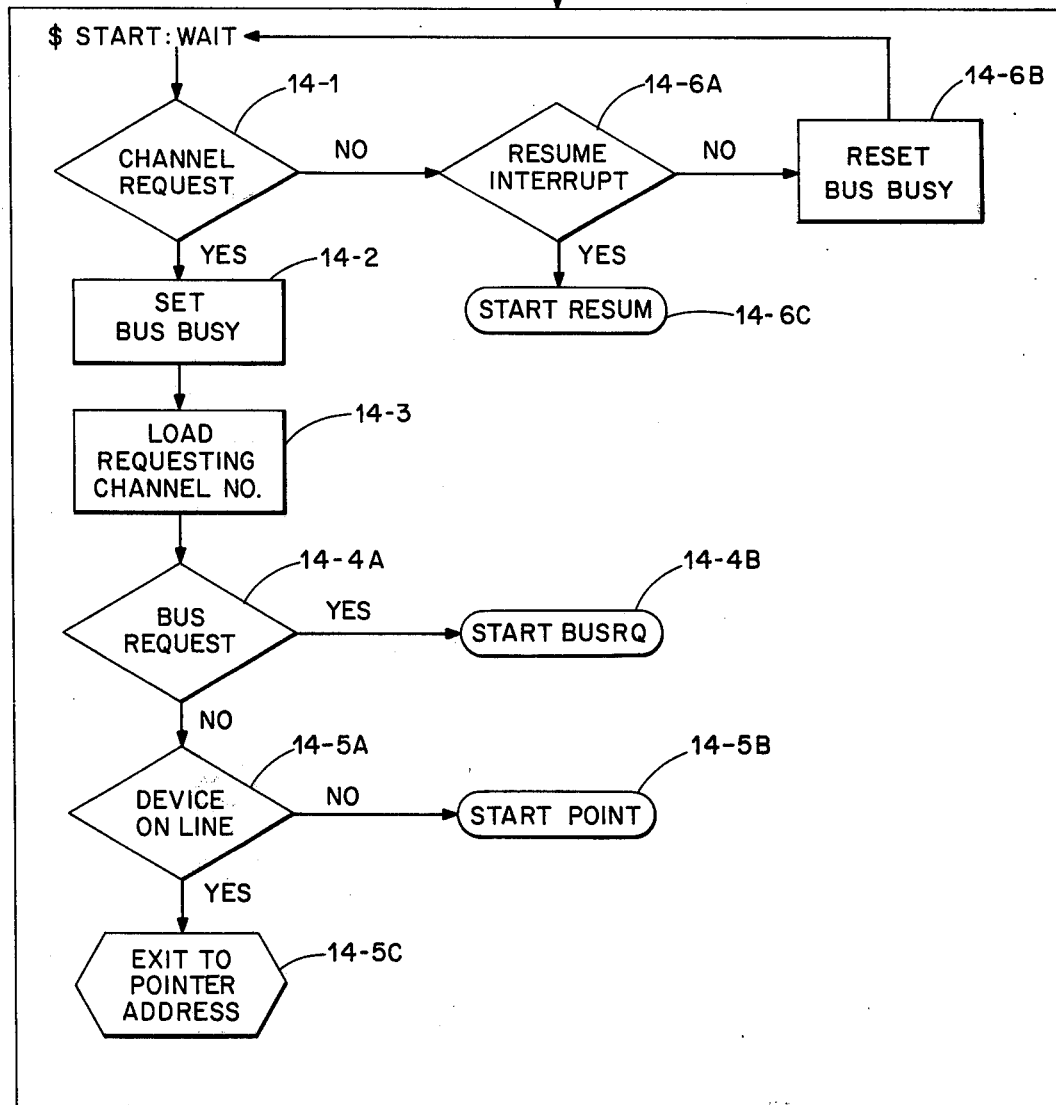
FIG. 14 is a flow diagram of the wait routine provided by the control store and associated logic of the controller of the present invention.

The wait routine, shown in FIG. 14, is responsible for prioritizing and initiating channel activity by testing status and the output of the channel request priority encoder 58. The wait routine may be entered directly from the routines shown.

14-1. A channel request indicates one or more events have occurred, such as an unsolicited bus cycle to the BDC; or a device adapter data request; or a device adapter service request.

14-2. If a channel request is active, the wait routine sets the bus interface register busy flop in the event that the request is due to an adapter. An adapter request may require a bus cycle, and the busy flop being set will prevent any unsolicited bus transfers from being acknowledged. Note that the busy flop is already set if the channel request is due to a bus request.

14-3. The wait routine loads the scratch pad memory index register 32 with the number of the channel whose request has highest priority. The high priority channel number is defined by the channel request priority encoder 58.

14-4. The wait routine branches to the bus request routine 86 if the high priority request is a bus request.

14-5. If a bus request is not active, the wait routine will return branch to the device support routine 80 provided that the device is on line. If the request was caused by a device going off line, the wait routine will branch to the point routine 78 which initializes the channel pointer.

14-6. If a channel request is not active, the wait routine tests the resume interrupt flop to determine if the CP has raised the resumt interrupt line, and will branch to the resume interrupt routine 88 if the flop is set. If the resume interrupt flop is reset, the wait routine will reset the bus interface register busy flop, thereby allowing unsolicited bus cycles to be acknowledged.

Figure 15:
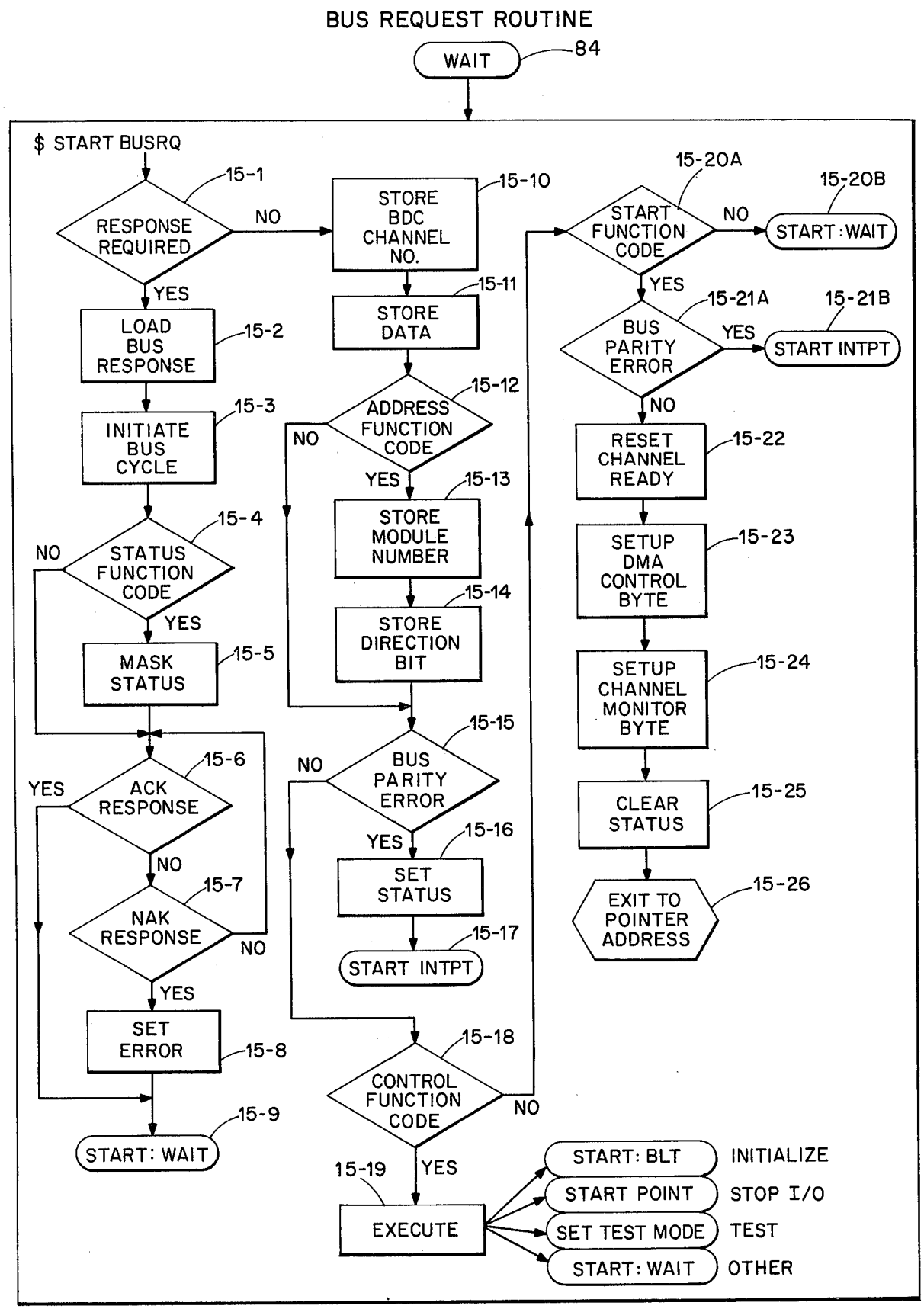
FIG. 15 is a flow diagram of a bus request routine provided by the control store and associated logic of the controller of the present invention.

Now referring to FIG. 15, the wait routine 84 branches to the bus request routine when it detects an unsolicited bus transfer to the BDC. The purpose of the bus request routine is to execute the I/O requirements of the bus transfer and to initiate any firmware routines if necessary. The flow of the bus request routine is as follows:

15-1. Bus status is tested to determine if the BDC must initiate a second half read cycle on the bus.

15-2. If a response is required, the bus request routine 86 loads the bus interface register 36 using the contents of the scratch pad memory location defined by the function code.

15-3. Cycle parameters are loaded and a bus cycle is initiated.

15-4. The function code is tested to determine if status was read by software.

15-5. The attention bit and the bus parity error bit of status are reset if the function code was for status.

15-6 & 7. The routine waits until an Ack or Nak is received.

15-8. If a Nak response is received, the routine sets the non-existant resources error in status.

15-9. The bus request routine has completed the second half read cycle and branches back to the wait routine.

15-10. If no response is required the BDC must store and decode information in the bus interface register 36. The first item to be stored is the BDC channel number, which is not otherwise visible to firmware. The channel number, as defined by information that was on bits 8 through 16 of the address bus, is stored in scratch pad memory 52.

15-11. The contents of the data bus are stored in scratch pad memory at an address defined by the function code.

15-12. The function code is tested to determine if a memory address was transferred to the BDC.

15-13. The memory module number, as defined by the high order 8 bits of the address bus, is stored in scratch pad memory 52.

15-14. The direction of data transfer, as defined by bit 17 of the address bus, is stored in the DMA control byte.

15-15. The bus request routine tests for parity errors during the transfer.

15-16. Bus parity error bit is set in status. Further, the interrupt level is forced to zero if an interrupt level was transferred during the bus cycle.

15-17. On detecting a parity error, the bus request routine branches to the interrupt routine 82.

15-18. If no parity errors are detected, the bus request routine decodes the function code and first tests for a control word.

15-19. If a control word was transferred, the BDC executes the first control bit set, starting with bit 0. If no action is required, the routine branches to the wait routine 84.

15-20. The function code for the bus transfer is compared against the start up function code stored in scratch pad memory 52. The bus request routine branches to the wait routine 84 if the compare is not true.

15-21. A startup function code was detected. Before initiating the device support routine, however, the bus request routine checks for any bus parity errors that have occurred on the same channel since the last time that status was read. The bus request routine inhibits the go command and branches to the interrupt routine 82 if the error is set.

15-22. The routine resets the channel ready flop which NAK's any further dialogue to the channel from the CPU.

15-23 & 24. The bus request routine sets up the channel monitor flag byte and the DMA control byte before going to the device support routine.

15-25. Status is cleared, except for the attention bit.

15-26. The bus request routine does a return branch to the device support routine.

Figure 16:
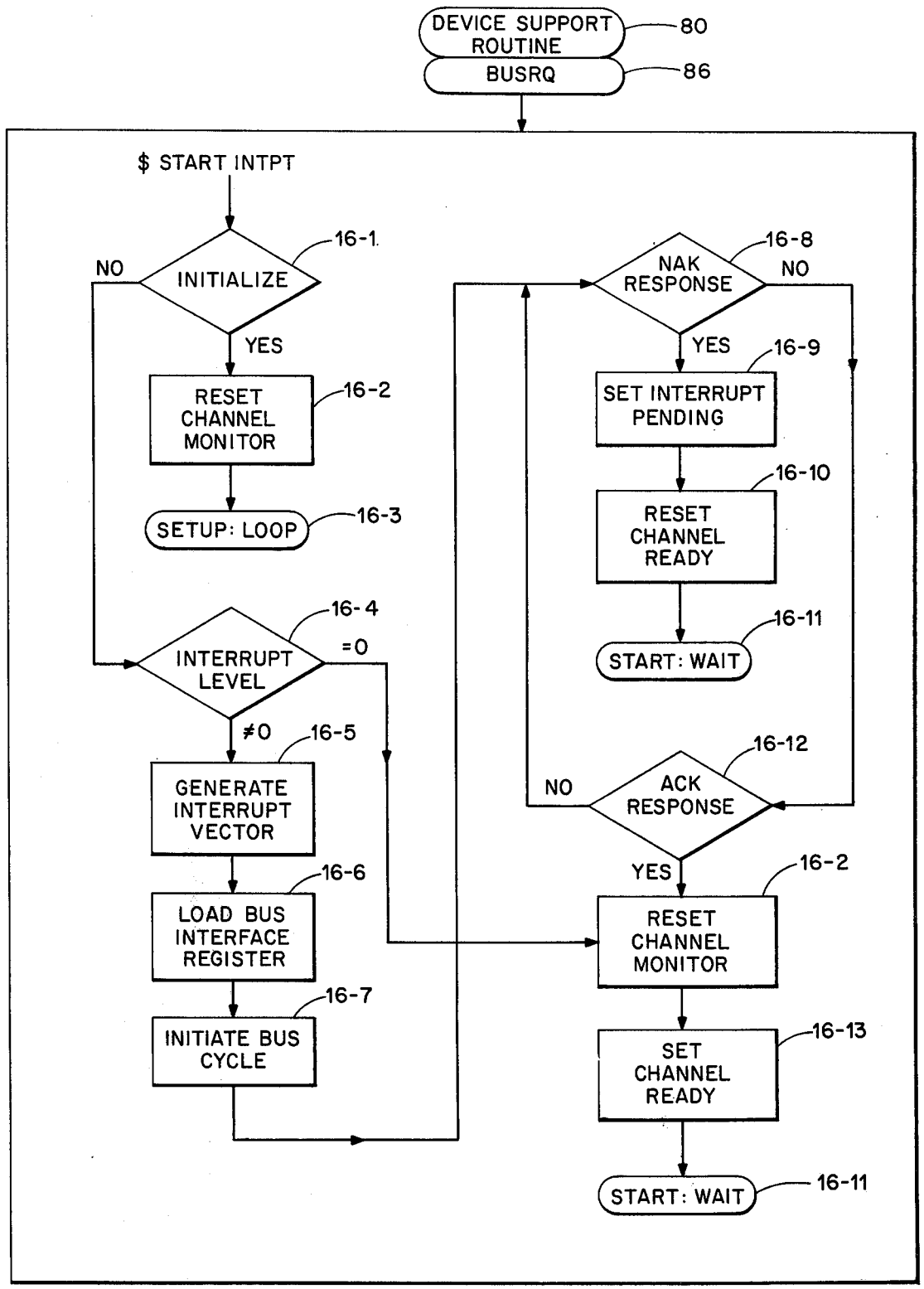
FIG. 16 is a flow diagram of the interrupt routine provided by the control store and associated logic of the controller of the present invention.

The interrupt routine shown in FIG. 16 examines the channel monitor flag byte and the interrupt level for a given channel to determine if an interrupt should be generated. The flow is as follows:

16-1. The initialize bit of the channel monitor flag byte is tested to determine if the BDC is undergoing initialization.

16-2. The channel monitor, which is stored in scratch pad memory 52 on a per channel basis, is reset to zero.

16-3. The interrupt routine branches to the (SETUP:-LOOP) address of the setup routine 76 which will proceed to setup the next channel.

16-4. The interrupt routine tests the interrupt level for zero.

16-5. If the interrupt level is not zero, the routine will interrupt and begins by generating that portion of the interrupt vector that is not readily available in scratch pad memory 52. The least significant bytes of the address bus and data bus are generated and stored in scratch pad memory in the event that the interrupt must be retried.

16-6. The bus interface register busy flop is set and the bus interface register 36 is loaded with address and data.

16-7. The interrupt routine loads cycle parameters and initiates a bus cycle providing it was able to set the busy flop, as evidenced by the absence of a bus request. The routine goes to step (9) if a bus request is present.

16-8 & 12. Having initiated a BUS cycle, the interrupt routine waits for an Ack or Nak response from the CPU.

16-9. If the interrupt is Nak'd, the routine sets the interrupt pending bit of the channel monitor byte in the scratch pad memory. The interrupt pending bit being set will cause the interrupt to be retried when the BDC detects a resume interrupt signal.

16-10. The channel ready flop is reset, which inhibits further bus dialogue to the channel.

16-11. The interrupt routine branches to the (START:WAIT) addresses of the wait routine 84.

16-13. The channel ready flop is set, which allows further bus dialogue to the channel.

Figure 17:
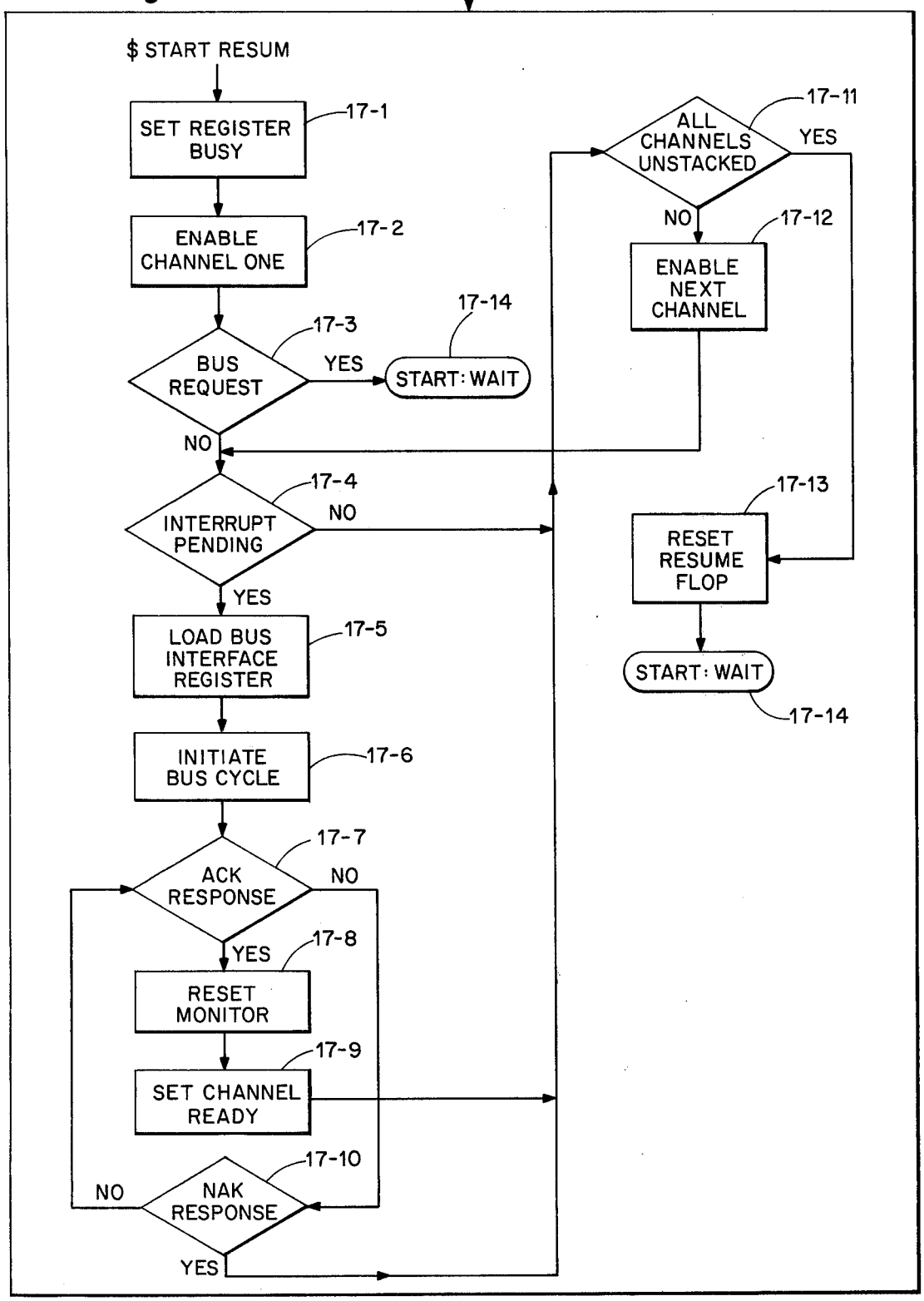
FIG. 17 is a flow diagram of the resume interrupt routine provided by the control store and associated logic of the present invention.

When the wait routine detects the resume interrupt flop is set, it branches to the resume interrupt routine shown in FIG. 17, which retries any interrupts that have been previously Nak'd. After all interrupts have been retried, the resume interrupt routine branches back to the wait routine 84. The operation is as follows:

17-1. The bus interface register busy flop is set to inhibit unsolicited BUS transfers to the BDC.

17-2. Channel 1 is enabled by loading the scratch pad memory index register 32.

17-3. If a bus cycle was acknowledged before the busy flop could be set in step (1) the resume interrupt routine must branch back to the wait routine, leaving the resume interrupt flop set.

17-4. The interrupt pending bit of the channel monitor byte is tested to determine if an interrupt by the channel was previously NAK'd.

17-5. The bus interface register 36 is loaded with the interrupt vector which was partially generated by the interrupt routine.

17-6. Cycle parameters are loaded and a BUS cycle is initiated.

17-7 & 10. The resume interrupt routine waits for an ACK or NAK response from the CPU.

17-8. The channel monitor byte, which is stored in scratch pad memory 52, is reset to zero if the interrupt is acknowledged.

17-9. The channel ready flop is set, which allows BUS transfers to the channel.

17-11. The resume interrupt routine tests the scratch pad memory index register 32 to determine if all channels have been unstacked.

17-12. If the routine is not finished, the next channel is enabled by loading the scratch pad memory index register 32 with the appropriate value.

17-13. Having unstacked all channels, the routine resets the resume interrupt flop.

17-14. The resume interrupt routine branches back to the wait routine.

The microinstructions of the controller of the present invention will now be discussed. A microinstruction is the smallest element of firmware, and consists of one or more bits of a control store word. A combination of one or more microinstructions defines each bit of a control store word and is collectively referred to as a firmware command. A sequence of firmware commands used to perform a particular function is a microprogram or firmware routine. The controller uses eight basic types of firmware commands, namely: miscellaneous, device adapter, bus logic, ALU, constant, memory, test, and branch commands. Only certain miscellaneous commands and certain ALU constant memory, test and branch commands are of interest for the purpose of describing the operation of the present invention. Each type of firmware command is identified by a particular op code, which is bits 0, 1 and 2 of the control store word. The following is a description of various microinstructions which are used to form various firmware commands.

A operands are used in most commands to specify the output of the A operand multiplexor, which goes to the bus interface register 36, scratch pad memory 52, test multiplexor 46 and ALU 42. Bits 3 through 5 of the microprogram instruction register 24 go to the A operand multiplexor and are used by it as an address to select 1 of 8 inputs. Simultaneously, bits 4 and 5 go to each device adapter's data selector and the device adapter that is enabled uses the bits to select 1 of its 4 data fields. The output of each adapter's data selector is wire or'd, but only the adapter that is enabled will enable its data selector. When disabled, the output of the adapter's data selector is at a high impedance state.

B operand microinstructions are used during ALU commands to explicitly define the address to the B operand multiplexor, whose output goes to the ALU 42. B operand microinstructions, which consist of bits 6 and 7 of the microprogram instruction register 24, are gated with the output of the opcode decoder 40 to determine the B operand.

Miscellaneous commands are primarily used to perform clear and set operations on registers and flops in the BDC and in the device adapters. Miscellaneous commands are typically comprised of a single microinstruction which specifies all bits of the control store word.

The following miscellaneous commands are of interest. The reset test mode (RTM) command takes the BDC out of test mode and is used by diagnostic software when a diagnostic program is to be terminated. This command generates the RTMCMD+00 signal which causes the TSTMOD+00 flop to reset. When the test mode flop resets the microprogram control store is enabled and the BDC clock resumes normal operation. The set test mode (STM) command generates the signal STMCMD+00 which sets the test mode flop (TSTMOD+00). The test mode flop being set will disable the microprogram control store 22, enable the diagnostic instruction gate 38, and put the BDC clock in step mode. For each subsequent bus cycle to the BDC, the data portion of the bus interface register 36 is loaded in the microprogram instruction register 24 and one clock cycle is generated. Diagnostic software may continue to send microinstructions over the bus 12 until a reset test mode command is executed, whereupon the BDC returns to normal functionality. The halt (HLT) command is used by BLT firmware when detecting an error and by bus request firmware when entering test mode. The halt command generates the signal HLTCMD-00 which causes the clock halt flop (CLKHLT+10) to set, thereby terminating all clock signals to the BDC and device adapters. When the test mode flop is on, the clock is stepped for every bus transfer to the BDC. When the test mode flop is off, the BDC clock is impervious to bus activity, except for master clear.

Device adapter commands are used to generate control signals which go from the BDC to the device adapters. The device adapter, which is enabled by the contents of the scratch pad memory index register 32, executes the commands; those adapters not enabled ignore all control signals. Device adapter commands use A operand microinstructions in conjunction with particular microinstructions to generate a complete firmware command. Bus logic commands are specified by a combination of microinstructions particular to bus commands and A operand microinstructions. The resulting commands are used to perform control functions on hardware associated with the NML bus. A operand microinstructions, B operand microinstructions and ALU microinstructions are used to fully define ALU commands. ALU commands perform a specific logic or arithmetic operation on the contents of the A and/or B operands and store the result in the A or B register. ALU microinstructions define the mode, carry enable, and carry input to the ALU 42. In addition, ALU microinstructions determine whether the A or B register is loaded and are decoded with the rest of the control store word to generate register control signals.

Constant commands are defined by a combination of A operand microinstructions and two types of constant microinstructions which specify a data constant and the type of ALU operation to be performed. The following constant commands are of interest. The load constant (LCN) command causes the 8 bit data field which is defined by bits 6-10, 12, 14-15 of the instruction register 24 to be loaded in the register defined by the A operand microinstruction. As with ALU commands, the constant is loaded in the accumulator 50 if the operand if the accumulator or scratch pad memory. In addition, constants may not be loaded directly into the bus interface register 36. And (ACN) constant commands cause the ALU 42 to AND the contents of the A operand with the 8 bit data constant defined by the instruction register 24. The result of the AND is loaded in the A operand register. Or constant (OCN) commands cause the ALU to OR the contents of the A operand with the date constant defined by the instruction register. The result of the OR is loaded in the A operand register.

Memory commands are used to write into scratch pad memory 52, and to control or alter scratch pad memory addresses. The following memory commands are of interest. The memory write (MWT) command stores the contents of the A operand in scratch pad memory 52 at the address specified by the low order 6 bits of the scratch pad memory address counter 54 and the 2 bits of the scratch pad address selector 56. The MWT microinstructioncauses the write strobe MWTCMD−OO to go active which performs the write operation. The increment memory address (IMA) command generates the signal IMACMD−OO which will force the scratch pad memory address counter 54 to increment by one. The SPMAC 54 can also be loaded with the result of ALU commands and constant commands to address a particular location of scratch pad memory 52. The write and increment address (WIA) command generates the signal WIACMD+OO which sets the WIAFLP+OO flop, indication that the address must be incremented during the next cycle. The write and increment address flop is or'd with the IMACMD−OO gate to force the scratch pad memory address counter 54 to increment. The set index mode (SIM) command and the reset index mod (RIM) command (collectively referred to as SRI) generate the signal SRICMD+OO which causes the scratch pad memory index control flop (SPMICF-+OO) to store the value of bit 9 of the instruction register 24. When set, the SMPICF+OO flop causes the scratch pad memory address counter 54 to be indexed by the contents of the index register 32. When the flop is reset, scratch pad memory 52 is addressed by the contents of the address counter 54 only.

Test commands allow firmware to determine the state of hardware elements in the BDC and in the device adapters. Return commands, which are classified with test commands, allow firmware to load the microprogram address counter 26 with an address that was previously stored in the subroutine return address register 30. One of the test commands of primary interest is the return (RTN) command which is decoded from the output of control store 22 rather than the output of the instruction register 24 to allow the execution of return commands in one clock cycle. When executing return commands, the signal RTNCMD−OO is active, causing the control signal LODUPA−OO to go active. The load microprogram address control signal causes the UPAC to load the output of the address selector 28, which for return commands is the contents of the subroutine return address register 30.

Branch commands are used to load the microprogram address counter 26 and the subroutine return address register 30 with a particular address. The branch command of primary interest is the go to (GTO) command which is decoded from the output of control store 22 to allow the execution of the command in one clock cycle. A go to command generates the signal GTOCMD−−OO which activates the signal LODUPA−OO. The control signal will cause the microprogram address counter 26 to load the output of the microprogram address selector 28, which for a go to command is the A field of the control store word.

Figure 18:
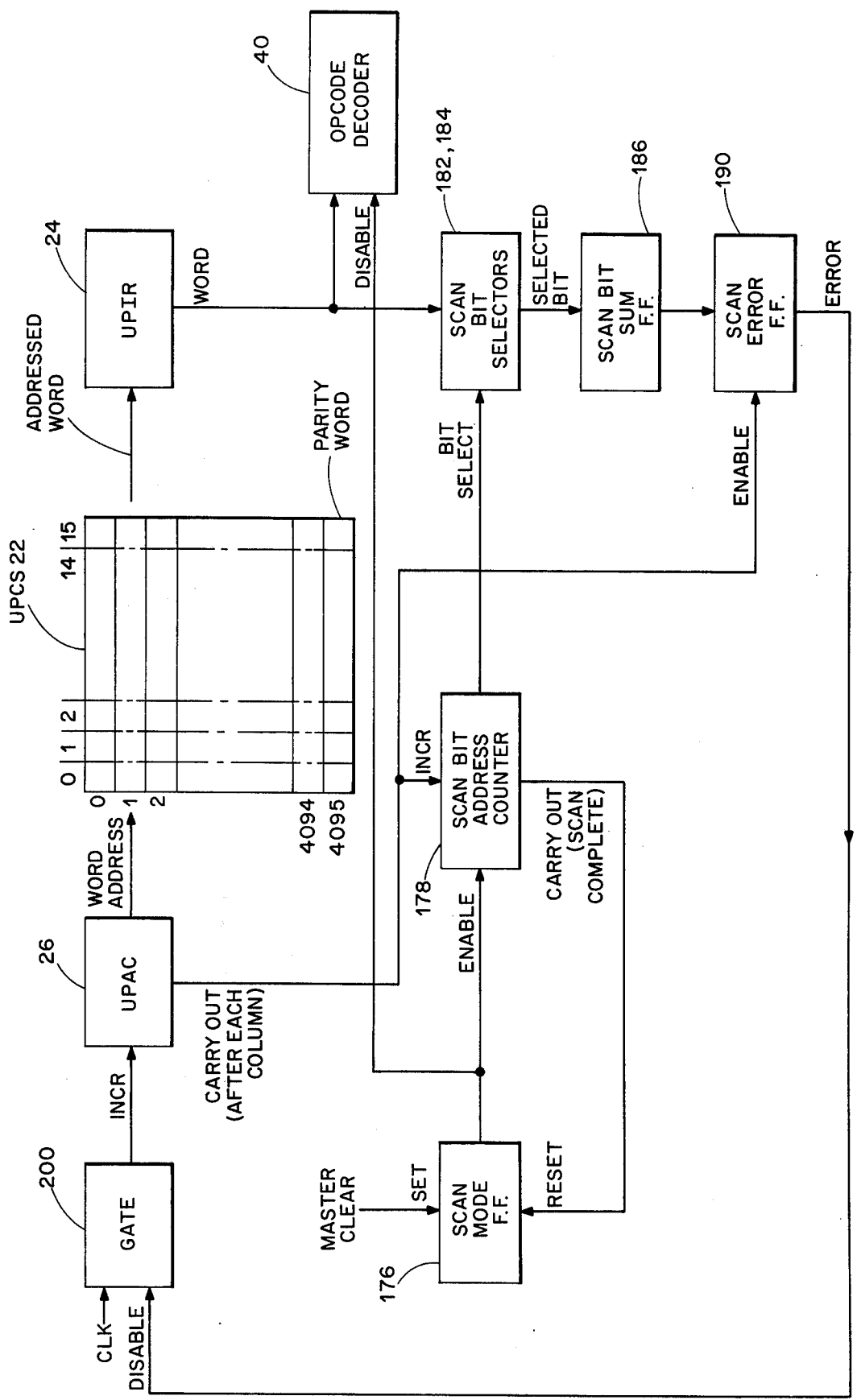
FIG. 18 illustrates more particularly the logic provided by the scan logic to test the control store for correct parity.

Now referring to FIG. 18, the manner in which the microprogram control store 22 is scanned to determine whether or not the correct parity exists is shown by way of a more particularlized block diagram. Control store 22 provides by way of example up to between 4096 locations, each having 16 bits for storing a word. Thus, the control store 22 includes 16 columns and 4096 word locations, the last location of which includes a parity word. The parity word is organized on a column basis. That is to say, the first 4095 locations in a particular column have either an even or odd parity and if it is desired to establish for example an even parity for that column, then a parity bit (binary "1" or "0") will be provided for that column so that the total 4096 locations will be even parity. The parity bit is provided for each column, that is, the establishment of the parity word is generated in a well known manner.

Thus, when it is desired to initialize the system, in response to a master clear signal, the scan mode flip-flop 176 will be set in order to enable a scan for the purpose of determining whether an error condition exists in the control store 22. Generally, the microprogram control store 22 will be examined a column at a time to determine after 4096 bits have been added whether a parity error exists. Following this the next column will be checked.

With scan mode flip-flop 176 set, this will disable the opcode decoder 40 which receives instructions from instruction register 24 so that erroneous or non-intelligent information is not transferred in the system as an instruction. The setting of scan mode flip-flop 176 also enables scan bit address counter 158 which is a four bit counter whose carry output is used to reset flip-flop 176 after the total scanning of all columns is complete.

Initially, the microprogram address counter 26, which is a 12 bit counter, addresses word location zero. In response to this, the word in location zero is transferred to the microprogram instruction register 24. The first bit i.e., bit zero of the word in register 24 is transferred via scan bit selectors 182 and 184 and added to the contents of scan bit sum flip-flop 186, the output of which is initially set to zero. Bit zero is selected by selectors 182 and 184 because of the output of counter 178. Counter 178 will count from zero to 15 and initially is set to zero upon receipt of the enable signal from scan mode flip-flop 176. Thus, the selectors 182 and 184 which comprise a plurality of gates have the appropriate gate enabled so as to pass bit zero of word zero into flip-flop 186, in which flip-flop, an add operation takes place. With flip-flop 186 equal to zero therefore, a binary one input would change the output to a binary one whereas a binary zero would leave the output at a binary zero. If during the adding of bits, the contents of sum flip-flop 186 is a binary one and a binary one is added thereto, then the output would then change to a binary zero. Error flip-flop 190 will be enabled after the scan of a column, at which time, if the content of scan flip-flop 190 is for example other than a binary zero, an error signal will be generated disabling gate 200.

Thus, microprogram address counter 26 is incremented for each clock cycle via gate 200 unless gate 200 is disabled. Gate 200 will be disabled only upon detection of an error after scanning a complete column. The clock will increment the counter 26 so as to scan through the 4096 word locations of control store 22. The bit select input to selectors 182 and 184 from counter 178 will remain the same for the first column. Thus, after all of the additions, including the addition of the column parity bit is made, the scan error flip-flop 190 will be enabled via the carry out of counter 26. This will indicate whether or not an error exists.

The next column is also scanned by means of the incrementing of scan bit address counter 178 via the carry out of counter 26 which generates a carry out after each column is scanned and via counter 26 for all of the word locations. The bit selected by a counter 178 will be bit number one, i.e. the second bit in the 16 bit word. This second column will also be scanned in similar fashion and an error will be indicated by a flip-flop 190 disabling gate 200 and thereby indicating to the operator via the bit select output of counter 178 which column is in error. Assuming no errors, scan bit address counter 178 will continue to select a particular bit and counter 26 the particular words so that upon the complete scan, counter 178 will generate a carry output which will reset flip-flop 176 and take the system out of the scan mode. Thus it can be seen that only one parity word is needed to insure the integrity of the information in control store 22 and that the operator can detect which column has an error by looking at the count from counter 178 when gate 200 is disabled.

Figure 19:
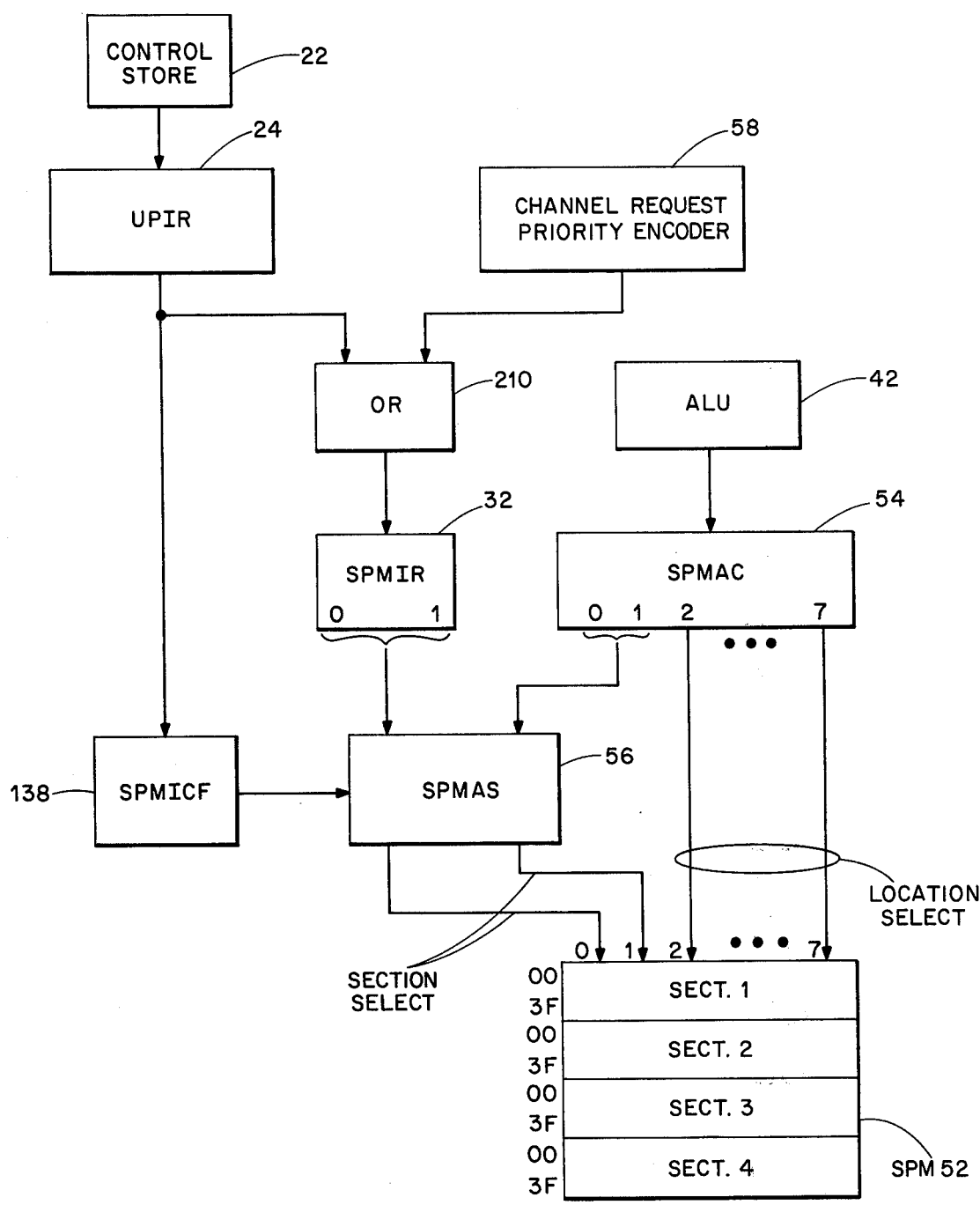
FIG. 19 is a logic diagram illustrating with more particularity the manner in which address formation is provided for the scratch pad memory of the controller of the present invention.

Now referring to FIG. 19, the scratch pad memory 52 is shown to include several sections. The number of sections corresponds to the number of channels or adapters coupled in the system. Thus, for four adapters, there are four sections or quadrants. Each such section includes the same topology as indicated hereinbefore in locations 00 to 3F. FIG. 19 further illustrates the manner in which the locations of the different sections are addressed without the need for generating such location address to be concerned with the generation of the actual section in which the location addressed is contained. That is, the location addressed is done so independently of the generation of the starting address for a particular section. The scratch pad memory address counter 54, by means of bits 2 through 7, generate the location address, whereas either bits 0 and 1 of counter 54 or the output of scratch pad memory index register 32 via selector 56 generate the section select signal for scratch pad memory 52.

Firmware provided by the control store 22 via the instruction register 24 either sets of resets the scratch pad memory index control flip-flop 138 so as to either select via the gating structure in selector 56 the zero and one bits from index register 32 or from address counter 54. Flip-flop 138 is normally set during the set-up routine so that the instruction selection in scrath pad memory 52 is made by means of the signals from index register 32. Normally, index register 32 points to the channel or adapter which is active and thus index register 32 recieves via or gating structure 210 such section address from register 24 or by means of encoder 58 which indicates the channel having the highest priority.

Although the channel which is active is accordingly normally addressed in such manner, the scratch pad memory address counter 54 may provide inputs via selector 56 to select another section independent of the adapter or channel which is currently active. Thus, for example, by means of input provided by any one of the registers or sources feeding the ALU 42, address counter 54 may address a section in scratch pad memory 52 independent of the channel which is currently active in order to change the contents of the location or locations for any other channel even though such other channel is not currently active. It can thus be seen that in addition to being able to address a section in memory 52 independent of the channel which is currently active, that by means of address counter 54, the location in the particular section may be addressed and thus the address of such location may be formed, without requiring in each instance the formation of the starting address for a particular section. That is, the starting address for the particular section is generated independently of the location addressed.

Figure 20:
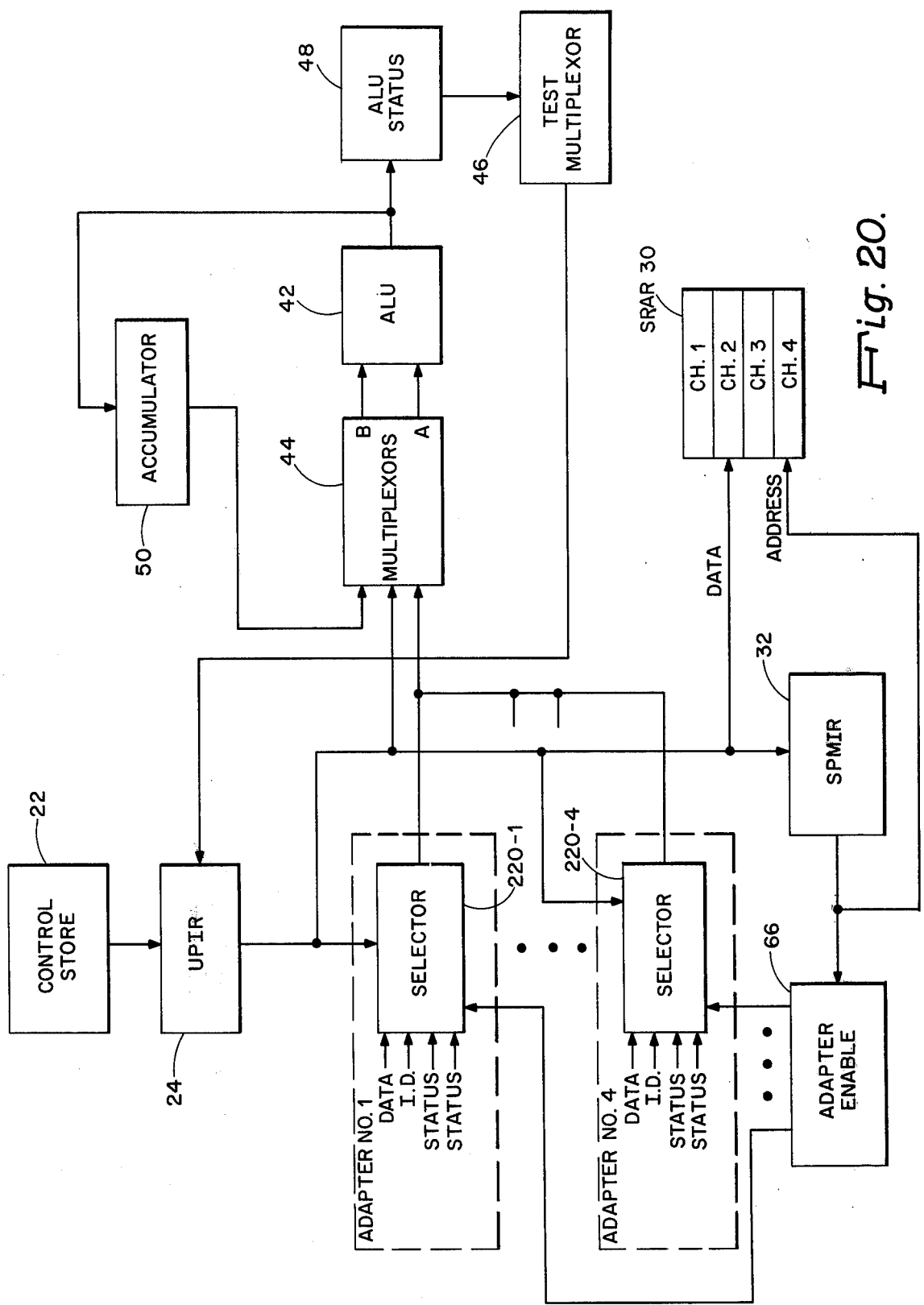
FIG. 20 is a logic diagram illustrating with more particularity the manner in which the devices coupled to a controller of the present invention are identified as to device type.

The manner in which a device connected in the system by means of the adapters is automatically identified as to type, i.e., whether the device is a printer, a disc, a card reader or a console for example, is shown in FIG. 20. Each different device has a particular I.D. code. For four different devices connected in the system, four different I.D. codes exist in the various adapters for the various devices. On the other hand, all such devices may be the same type and therefore have the same I.D. code, the particular device being identified by its channel connection. In order to enable ease of configuration of the system, that is to say, in order to allow the system builder to connect any device in any channel location, it then becomes desirable to automatically enable the identification of the device type independent of its channel connection. Accordingly, upon initialization of the system, the device type must be identified in conjunction with the particular system channel to which it is coupled.

The object accordingly is to place the starting address of the subroutine for a particular device in the respective register location of subroutine return address registers 30, which comprise four 12-bit registers for storing such starting routine addresses, one such register for each channel. Subroutine return address register 30 is addressed by means of the output of the scratch pad memory index register 32. The adapters, which comprise four in number for the four channels, by way of illustration, each include selectors 220 which are arranged so that when enabled by means of adapter enable 66, present one of four inputs to the output of the enabled selector 220. One of such inputs is the I.D. code of the particular device. Only one such selector 220 is enabled by adapter enable 66 which adapter enable 66 may include simply a one out of four decoder. The actual output of each respective selector 220 is selected in response to two bits from the microprogram instruction register 24 which includes the instruction received from control store 22. The one of such selectors enabled by means of adapter enable 66 is determined by the output of the index register 32 which in addition to addressing the registers 30 also provides the input to adapter enable 66.

To determine which device is coupled to each adapter, the adapters are selected one by one for such determination. Accordingly for initial conditions, in response to a micro-instruction in register 32, selector 220-1 is enabled and the I.D. code is selected. The output of selector 220-1 is provided to multiplexers 44 and at the A output thereof to ALU 42. In general, this I.D. code is compared successively with known I.D. codes for different device types until there is a compare generated by ALU 42 at which time one of the ALU status flip-flops 48 generates a signal to enable control store 22 in register 24 to load the subroutine starting address for this device in appropriate registers of registers 30.

The manner in which this comparison is made in the ALU 42 is as follows. The control store 22 provides to the multiplexers 44 and via the ALU 42 to the accumulator 50 the I.D. code first for example for a printer as shown in the point routine. Then the control store 22 issues the code to cause the enabled selector 220 to provide the device I.D. code to multiplexers 44. This I.D. code is provided from the A output of multiplexers 44 to the ALU 42 as is the known I.D. code for a printer via the B output of multiplexers 44 to the other input of the ALU 42. If there is a comparison, then this is reflected in the ALU status flip-flop 48 which in turn enables the control store 22 via register 24 to place the subroutine starting address in the addressed register of subroutine return address registers 30. If there was no compare by the ALU 42, then the control store 22 issues the known code for, for example, a card reader, and the above process is repeated. If there is no comparison, then the known code for a device is provided, following which if there is no compare, the known I.D. code for a console is provided. Normally, one of such known I.D. codes will compare with the I.D. code from the enabled adapter. However, if there is no such compare, this will be reflected in one of the ALU status flip-flops 48 and accordingly will indicate that this is an unsupported or nonexistant device.

After a determination is thus made and accordingly the device I.D. identified for the particular enabled adapter, and the subroutine address placed in the addressed register of registers 30, then the next adapter is enabled by the incrementing of the address in register 32 by means of the control store 22 and the process continues until all adapters are enabled and devices identified. Accordingly, following this complete operation, the subroutine return address registers 30 should include the starting address of each subroutine for the identified devices.

Having described the invention, what is claimed as new and novel and for which it is desired to secure Letters Patent is:

1. Apparatus comprising:
   A. means for storing information, said means for storing including a plurality of word locations, each for storing a word, each of said word locations including a plurality of bit locations, each for storing a bit, said bit locations in the same position in each of said word locations forming a column of bit locations, one of said word locations including a parity bit in each said bit location in order to indicate the integrity of said information on a said column basis;
   B. means for sequentially accessing said words in each of said word locations in said means for storing;
   C. column selector means for accessing one bit in the same bit location for each of said words accessed from said word locations, thereby selecting one of said columns for the purpose of indicating the integrity of the contents thereof;
   D. means for adding the value of the accessed bits for the same bit location in each of said accessed words until all of said bits in one said column identified by said same bit location are added together thereby generating a final value; and
   E. means for detecting whether said final value indicates an error condition.

2. Apparatus as in claim 1 further comprising:
   A. means for enabling said column selector means to select another said column; and
   B. means for enabling said means for sequentially accessing in response to the selection by said column selector means of another said column, in order to indicate the integrity of the contents of said another said column.

3. Apparatus as in claim 1 wherein said means for sequentially accessing includes:
   A. address counter means;
   B. means for incrementing the contents of said address counter means at a uniform rate; and
   C. means for disabling said means for incrementing in response to a said error condition.

4. Apparatus as in claim 1 wherein said column selector means includes:
   A. address counter means;
   B. means, responsive to said means for sequentially accessing for incrementing the contents of said address counter means after each sequential access of all of the words in all of said word locations;
   C. a plurality of gates; and
   D. means responsive to the contents of said address counter for enabling at least one of said gates so that the said accessed bit is provided as an input of said means for adding.

5. Apparatus as in claim 1 further comprising:
   A. a memory register coupled with said means for storing, for receiving said accessed words, said words including instructions;
   B. data processing means responsive to said instructions;
   C. means for indicating that an integrity check of said information has been initiated;
   D. means, responsive to said means for indicating, for generating a signal indicating that the integrity check of said information has been initiated; and
   D. means, responsive to said signal, for disabling said data processing means from being responsive to said instructions.

6. Apparatus as in claim 5 further comprising means, responsive to the completion of the indication of the integrity of said information, for disabling said signal, thereby reenabling said data processing means to be responsive to said instructions.

7. Apparatus as in claim 1 wherein said parity bits are included in each bit position of the last one of said plurality of word locations.

8. Apparatus as in claim 1 wherein said means for sequentially accessing and said column selector means includes:
   A. a first counter, the count of which may be changed for use in addressing different ones of said word locations;
   B. a second counter, the count of which may be changed for use in addressing different ones of said bit locations;

C. means for addressing said word locations with the count of said first counter;
D. means for selecting a bit location with the count of said second counter;
E. means for enabling said first counter to address each of said word locations in a sequential manner; and
F. means, responsive to said means for enabling, for enabling said means for selecting to select another bit location each time the addressing of all of said word locations has been completed.

9. Apparatus as in claim 8 further comprising means for disabling any further change in the addressing provided by either said first counter or said second counter, in response to a said error conditions.

10. Apparatus as in claim 9 further comprising:
A. a memory register coupled with said means for storing for receiving said accessed words, said words including instructions;
B. data processing means responsive to said instructions;
C. means for indicating that an integrity check of said information has been initiated;
D. means, responsive to said means for indicating, for generating a signal indicating that the integrity check of said information has been initiated; and
E. means, responsive to said signal, for disabling said data processing means from being responsive to said instructions.

11. Apparatus as in claim 10 further comprising means, responsive to the completion of the indication of the integrity of said information, for disabling said signal thereby reenabling said data processing means to be responsive to said instructions.

12. A process for indicating the integrity of information stored in a memory which includes a plurality of word locations, which word locations include a plurality of bit locations, wherein said bit locations in the same position for each word location form a column and wherein a parity bit is included in one bit location of each said column, said process comprising the steps of:
A. selecting a column;
B. accessing the contents of each of said word locations;
C. adding that portion of the accessed contents of each of said word locations as determined by said step of selecting in order to generate a signal;
D. repeating said steps of selecting, accessing, and adding if said signal indicates that the integrity of said information is acceptable; and
E. stopping said process if said signal indicates that the integrity of said information is not acceptable.

13. A process as in claim 12 wherein said memory includes information for directing the operation of data processing means, said process further comprising the steps of:
A. generating a signal indicating that the integrity of said information is in the process of being indicated; and
B. disabling said data processing means from responding to the accessed contents of said memory in response to said signal.

* * * * *